US008576601B2

(12) United States Patent
Marukame et al.

(10) Patent No.: US 8,576,601 B2
(45) Date of Patent: Nov. 5, 2013

(54) CONTENT ADDRESSABLE MEMORY

(75) Inventors: Takao Marukame, Tokyo (JP); Tomoaki Inokuchi, Yokohama (JP); Hideyuki Sugiyama, Kawasaki (JP); Mizue Ishikawa, Yokohama (JP); Yoshiaki Saito, Kawasaki (JP); Atsuhiro Kinoshita, Kamakura (JP); Kosuke Tatsumura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/403,398

(22) Filed: Feb. 23, 2012

(65) Prior Publication Data

US 2012/0218802 A1   Aug. 30, 2012

(30) Foreign Application Priority Data

Feb. 24, 2011   (JP) ................................. 2011-038699

(51) Int. Cl.
*G11C 15/02* (2006.01)
(52) U.S. Cl.
USPC ............................................. 365/50; 365/158
(58) Field of Classification Search
USPC .................................................... 365/50, 158
See application file for complete search history.

(56) References Cited

U.S. PATENT DOCUMENTS

2006/0220161 A1* 10/2006 Saito et al. ..................... 257/421
2007/0115716 A1* 5/2007 Saito et al. ..................... 365/158
2008/0017843 A1* 1/2008 Kaushal et al. ................. 257/14
2008/0061332 A1* 3/2008 Saito et al. ..................... 257/295
2008/0067501 A1* 3/2008 Sugahara et al. ............... 257/38
2009/0179667 A1* 7/2009 Sugiyama et al. .............. 326/38
2010/0073025 A1* 3/2010 Tanamoto et al. .............. 326/41
2011/0278596 A1* 11/2011 Aigo et al. ...................... 257/77

FOREIGN PATENT DOCUMENTS

JP   2010-074001   4/2010

OTHER PUBLICATIONS

Wang, "Magnetic Random Accessible Memory Based Magnetic Content Addressable Memory Cell Design", IEEE Transactions on Magnetics, vol. 46, No. 6, pp. 1967-1970, (Jun. 2010).
Matsunaga, et al., "Standby-Power-Free Compact Ternary Content-Addressable Memory Cell Chip Using Magnetic Tunnel Junction Devices", Applied Physics Express 2, The Japan Society of Applied Physics, pp. 023004-1-023004-3, (2009).
Notice of Preliminary Rejection issued by the Korean Intellectual Property Office on Jul. 5, 2013, for Korean Patent Application No. 10-2012-18523, and English-language translation thereof.

* cited by examiner

*Primary Examiner* — Hoai V Ho
*Assistant Examiner* — Jay Radke
(74) *Attorney, Agent, or Firm* — Finnegan, Henderson, Farabow, Garrett & Dunner, L.L.P.

(57) ABSTRACT

One embodiment provides a content addressable memory, including: a pair of spin MOSFETs including: a first spin MOSFET whose magnetization state is set in accordance with stored data; and a second spin MOSFET whose magnetization state is set in accordance with the stored data, the second spin MOSFET being connected in parallel with the first spin MOSFET; a first wiring configured to apply a gate voltage so that any one of the first spin MOSFET and the second spin MOSFET becomes electrically conductive in accordance with search data; and a second wiring configured to apply a current to both of the first spin MOSFET and the second spin MOSFET.

18 Claims, 32 Drawing Sheets

FIG. 11

| SL | Spin nMOS | Spin pMOS | Current | Match/mismatch |
|---|---|---|---|---|
| V=1<br>(S'L:V=0) | P | P | Large | Don't care |
| | P | AP | Large | Match |
| | AP | P | Small | Miss |
| V=0<br>(S'L:V=1) | P | P | Large | Don't care |
| | P | AP | Small | Miss |
| | AP | P | Large | Match |

FIG. 12

| | S | S' | C | C' | S·C | S'·C' | S·C+S'·C' | (S·C+S'·C')' |
|---|---|---|---|---|---|---|---|---|
| | | | REVERSE BIT | | | | | XOR |
| MATCH | 0 | 1 | 0 | 1 | 0 | 1 | 1 | 0 (match) |
| MISMATCH | 0 | 1 | 1 | 0 | 0 | 0 | 0 | 1 (miss) |
| MISMATCH | 1 | 0 | 0 | 1 | 0 | 0 | 0 | 1 (miss) |
| MATCH | 1 | 0 | 1 | 0 | 1 | 0 | 1 | 0 (match) |
| Don't care | 0 | 1 | 1 | 1 | 0 | 1 | 1 | 0 (pass) |
| Don't care | 1 | 0 | 1 | 1 | 1 | 0 | 1 | 0 (pass) |

US 8,576,601 B2

CONTENT ADDRESSABLE MEMORY

CROSS-REFERENCE TO RELATED APPLICATION(S)

This application claims priority from Japanese Patent Application No. 2011-038699 filed on Feb. 24, 2011, the entire contents of which are incorporated herein by reference.

FIELD

Embodiments described herein relate generally to a content addressable memory.

BACKGROUND

Content addressable memory (CAM) is used, for example, between a router and a CPU/cache or the like, so that high speed searching is performed. In a general memory like an RAM such as an SRAM or DRAM sends back data stored in a particular address upon designation of the address. On the contrary, the CAM retrieves stored data matching with designated search data from all contents and sends back an address where the stored data is stored upon designation of the search data. In practice, the CAM is combined with an ordinary RAM as a CAM/RAM and functions such that, when a certain data word is inputted from a user, another data word associated with the data word is outputted.

The CAM can perform searching at a higher speed than the RAM in all searching purposes. However, since the CAM requires a physical memory space for searching, the circuit area becomes large. In the CAM which operates perfectly concurrently, a circuit for comparison with input data in accordance with all bits in the memory is required differently from the RAM composed of simple storage cells. Moreover, in order to find not matching one bit but matching a data word as a whole, a circuit for collecting comparison results is also required. Since the circuit area of the CAM increases because of these additional circuits, the manufacturing cost increases. And, since increase of the circuit area results in relative reduction of a data storing region, the memory space is relatively decreased. Further, since the above-mentioned comparison circuit performs a standby operation so as to wait for data input, large static power consumption is required compared with the RAM. As a result, search speed has a trade-off relationship with cost and power consumption. And, the CAM is used almost mainly for the case where searching at a very high speed is essential.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

FIGS. 11 and 12 illustrate an operation of the CAM cell.

DETAILED DESCRIPTION

One embodiment provides a content addressable memory, including: a pair of spin MOSFETs including: a first spin MOSFET whose magnetization state is set in accordance with stored data; and a second spin MOSFET whose magnetization state is set in accordance with the stored data, the second spin MOSFET being connected in parallel with the first spin MOSFET; a first wiring configured to apply a gate voltage so that any one of the first spin MOSFET and the second spin MOSFET becomes electrically conductive in accordance with search data; and a second wiring configured to apply a current to both of the first spin MOSFET and the second spin MOSFET.

First Embodiment

Figure 1:
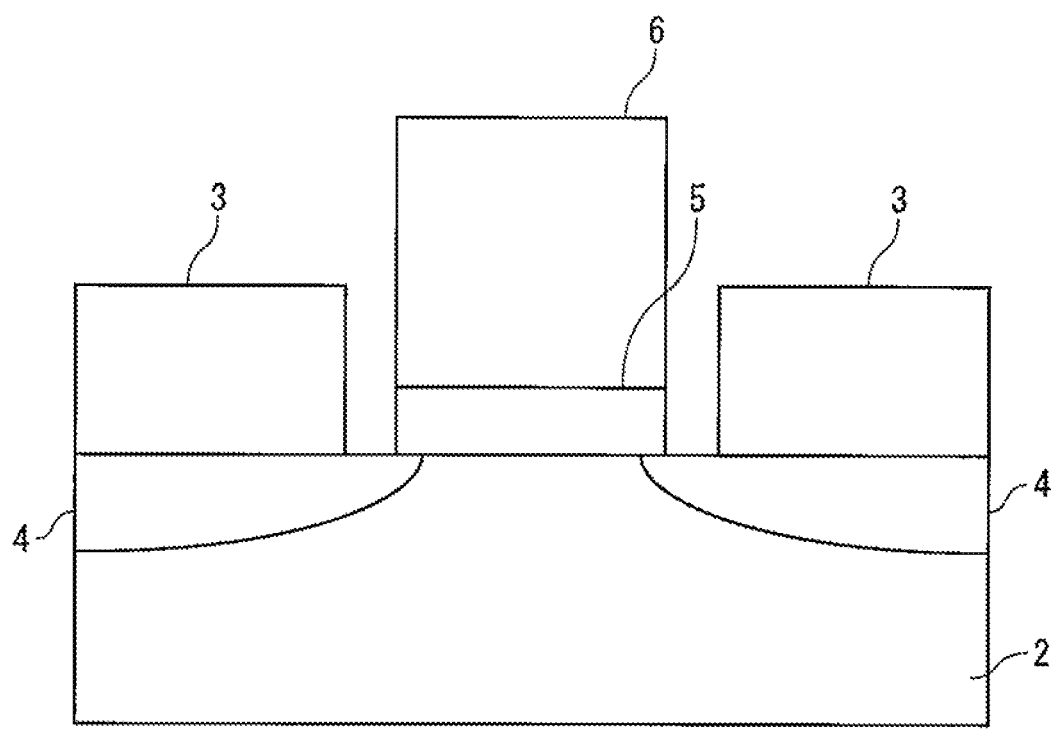
FIG. 1 illustrates a spin MOSFET.

An embodiment will be described below with reference to the drawings. FIG. 1 illustrates a spin MOS field effect transistor (spin MOSFET). The spin MOSFET 1 has source/drain (S/D) electrodes 3. The S/D electrodes 3 are made of magnetic substances (spin-polarized materials) and separated from each other on a semiconductor substrate 2. While one of the S/D electrodes 3 has a magnetic layer whose magnetization direction is fixed, the other of the S/D electrodes 3 has a magnetic layer whose magnetization direction is changeable. Diffusion layers 4 are formed under the S/D electrodes 3 respectively. Between the diffusion layers 4, a gate insulating film 5 is formed on the semiconductor substrate 2, and a gate electrode 6 is formed on the gate insulating film 5.

In the spin MOSFET 1, when a gate voltage is applied to the gate electrode 6, a channel is formed in the semiconductor substrate 2, and electrons are transmitted through the channel while being kept spin-polarized. As for the relation between the magnetization direction of the source magnetic substance and the magnetization direction of the drain magnetic substance, there are a parallel state in which the magnetization directions of the two magnetic substances are substantially parallel, and an anti-parallel state in which the magnetization directions of the two magnetic substances are substantially anti-parallel. The resistance value between the two magnetic substances varies according to whether the magnetization directions of the two magnetic substances are parallel or anti-parallel. The resistance value in the parallel state is lower than that in the anti-parallel state, so that the output current in the parallel state is larger than that in the anti-parallel state.

Figure 2:
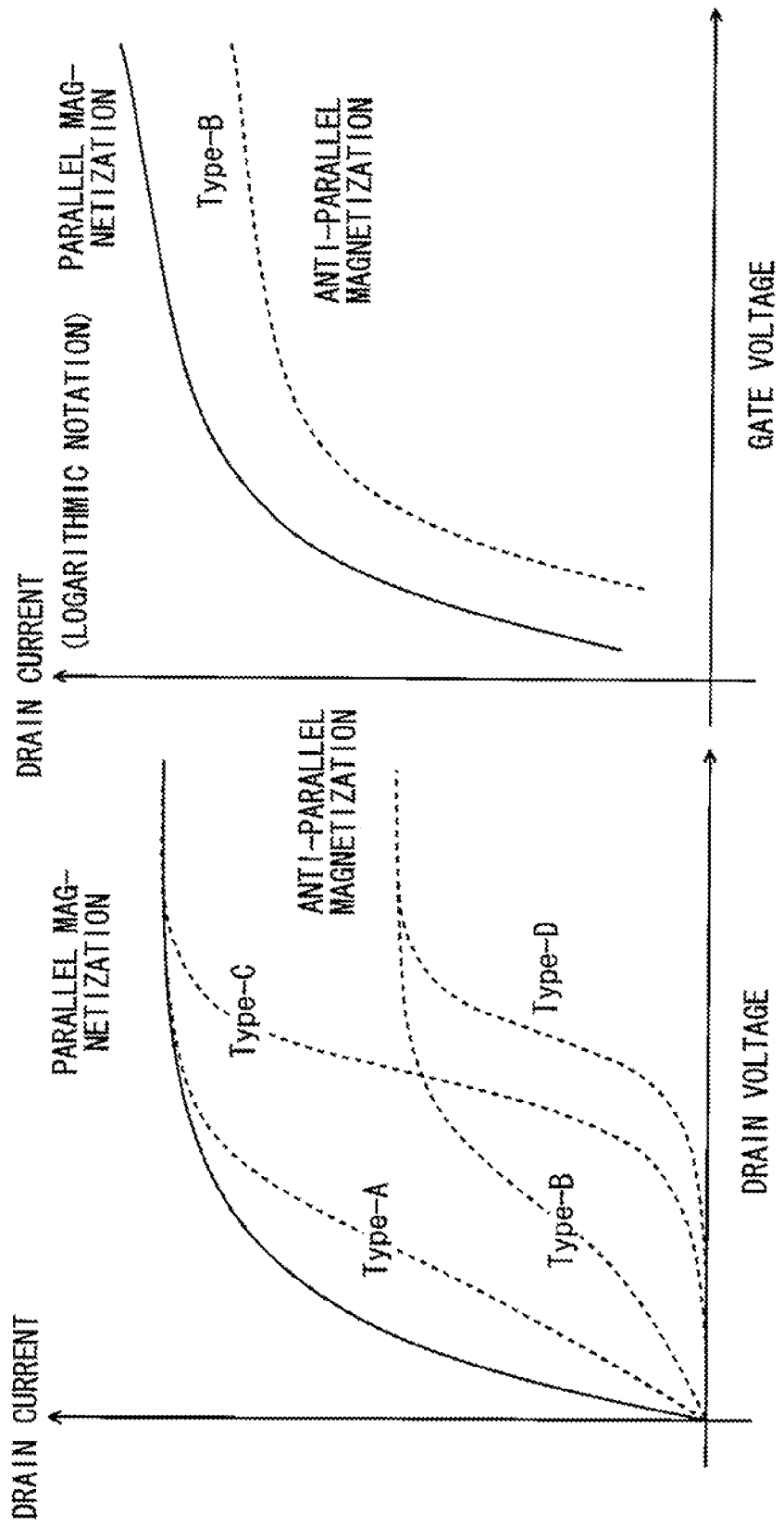
FIGS. 2A and 2B illustrate characteristic of a spin MOSFET.

FIGS. 2A and 2B illustrate Id-Vd characteristics and Id-Vg characteristics of a spin MOSFET. In FIGS. 2A and 2B, characteristic in parallel magnetization is expressed by the solid line, and characteristic in anti-parallel magnetization is expressed by the broken line. As illustrated in FIGS. 2A and 2B, when the magnetization directions are parallel, the current becomes so large that the same driving current as that of an ordinary MOSFET is obtained. On the other hand, when the magnetization directions are anti-parallel, the current becomes smaller than that in parallel magnetization. The behavior in anti-parallel magnetization is classified into several types based on operating mechanisms. For example, when the rate of spin polarization in the magnetic substance is so low that the magnetic reluctance is low, Id-Vd characteristic as represented by Type-A in FIG. 2A is exhibited. When the electrode of the spin MOSFET has a gap in either of spin-up or spin-down bands as in half metal, such Id-Vd characteristic that a threshold changes is exhibited (Type-C in FIG. 2A). When scattering occurs intensely around a drain region, such Id-Vd characteristic that mobility is reduced is exhibited (Type-B in FIGS. 2A and 2B). When both effects of Type-B and Type-C in FIGS. 2A and 2B appear, such Id-Vd characteristic that mobility is reduced while the threshold changes is exhibited (Type-D in FIG. 2A). These effects are determined depending on materials and structures of electrodes and substrate (channel formation region) of the spin MOSFET, characteristics may be exhibited as a combination of some operation principles.

The difference between currents according to the magnetization state can be used for reading whether the magnetization directions of the source and drain magnetic substances are parallel or anti-parallel. In the following description, when the magnetization directions are anti-parallel, Id-Vd characteristic is assumed Type-B in which mobility changes. Although the case where the relationship between the magnetization directions of the source and drain magnetic substances is switched between a parallel state and an anti-parallel state is exemplified, it may be switched between other kinds of states as long as resistance of the spin MOSFET varies depending on the states. That is, majority spin need not be transmitted when the magnetization directions of the spin MOS are parallel in the same manner as in the case of MTJ (Magnetic Tunnel Junction).

Figure 3:
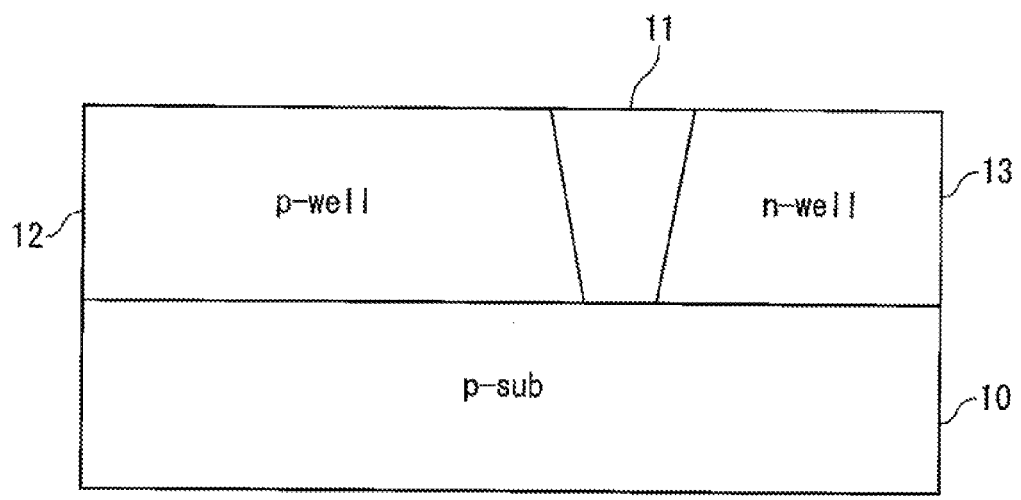
FIGS. 3 to 9 illustrate a method of producing a spin MOSFET according to an embodiment.

A method of producing a spin MOSFET according to the embodiment will be described below. Here, an n-type spin MOSFET is exemplified. As illustrated in FIG. 3, an element isolation region (STI: Shallow Trench Isolation) 11 of a silicon oxide film is formed on a p-type silicon semiconductor substrate 10, for example, having (100) surface orientation and doped with about $10^{15}$ atoms/cm$^3$ of boron (B). A first semiconductor region (p-well) 12 is formed on one side of the element isolation region 11 by ion/impurity implantation, while using the element isolation region 11 as a boundary. For example, an n-type spin MOSFET is formed in the first semiconductor region 12. On the other hand, for example, a second semiconductor region (n-well) 13 is formed by ion/impurity implantation at a region adjacent to the first semiconductor region 12 with respect to the element isolation region 11, and a p-type spin MOSFET is formed in the second semiconductor region 13.

Figure 4:
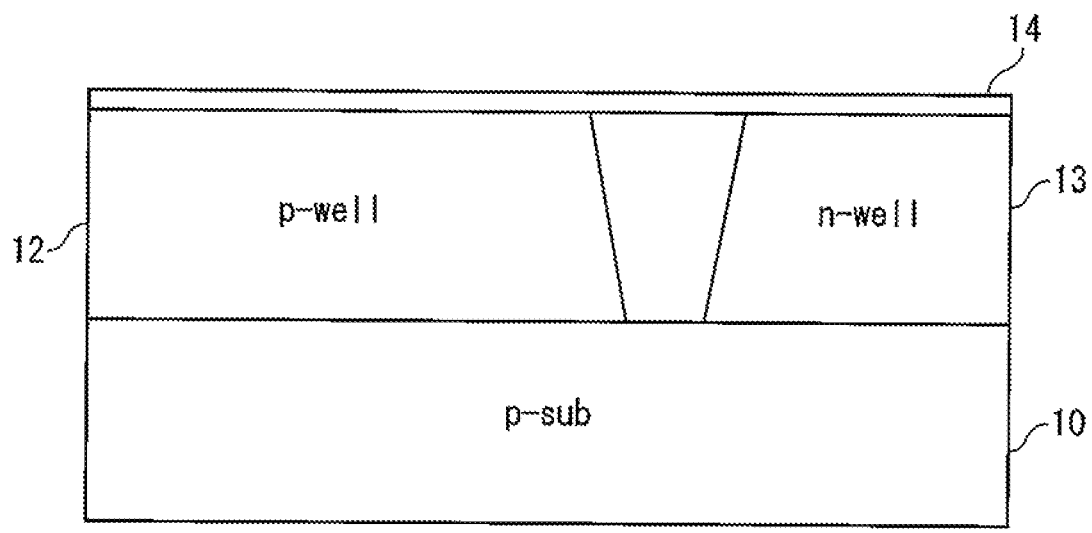

As illustrated in FIG. 4, a gate insulating film 14 about 1 nm thick is formed on the semiconductor region 12. For example, a silicon oxide film is formed as the gate insulating film 14 by a thermal oxidation method. The gate insulating film 14 need not be limited thereto, and for example, an insulating film material (high dielectric constant insulating film) having a higher dielectric constant than that of a silicon oxide film may be used. Specifically, $La_2O_5$, $La_2O_3$, $CeO_2$, $ZrO_2$, $HfO_2$, $SrTiO_3$, $PrO_3$, $LaAlO_3$, $Si_3N_4$, $Al_2O_3$, $Ta_2O_5$, $TiO_2$, etc. may be used for the gate insulating film 14. Alternatively, an insulating film formed by adding nitrogen or fluorine to a silicon oxide film or a high dielectric constant insulating film may be used. An insulating film formed by changing the composition ratio of these chemical compounds or a composite film formed by combining insulating films may be used. An insulating film such as Zr silicate or Hf silicate formed by adding metal ions to silicon oxide may be used.

Figure 5:
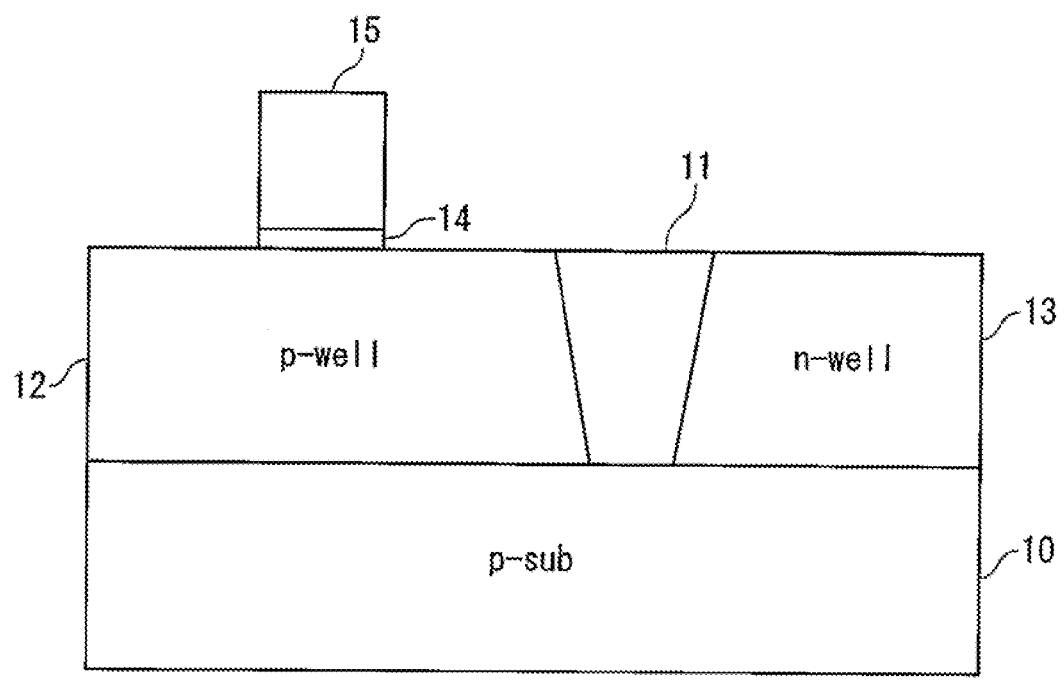

Then, a polysilicon film (for forming a gate electrode) about 100-150 nm thick which will serve as a gate electrode is deposited on the gate insulating film 14 by a low-pressure chemical vapor deposition (LP-CVD) method. As illustrated in FIG. 5, the gate insulating film 14 and the polysilicon film thereon are patterned by lithography and etching technology such as reactive ion etching (RIE) to form a gate electrode 15 and the gate insulating film 14 with a gate length of not larger than about 30 nm. If necessary, post-oxidation is performed to form an oxide film 1-2 nm thick.

The material of the gate electrode 15 is not limited to polysilicon. For example, a so-called metal gate material (e.g. a single metal such as Ti, Ta or W, nitride, carbide, oxide, etc.) may be used.

Figure 6:
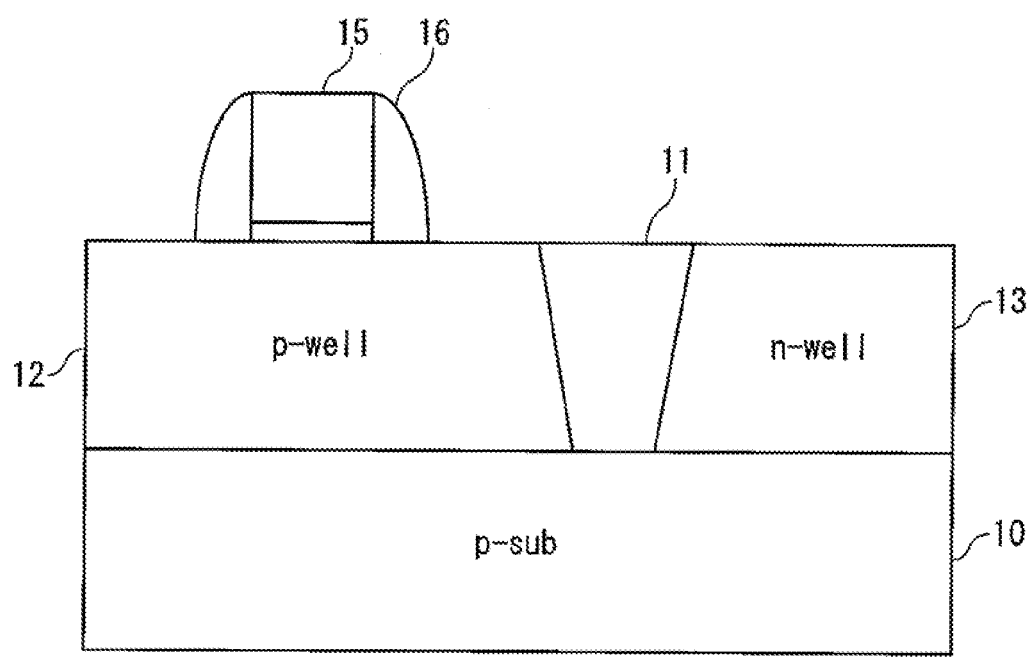

Then, a silicon nitride film about 8 nm thick is deposited on the semiconductor substrate 10 by an LP-CVD method. The silicon nitride film is etched back by an ME method so as to be left only on side surfaces of the gate electrode 15, thereby forming side insulating films 16 as illustrated in FIG. 6.

Figure 7:
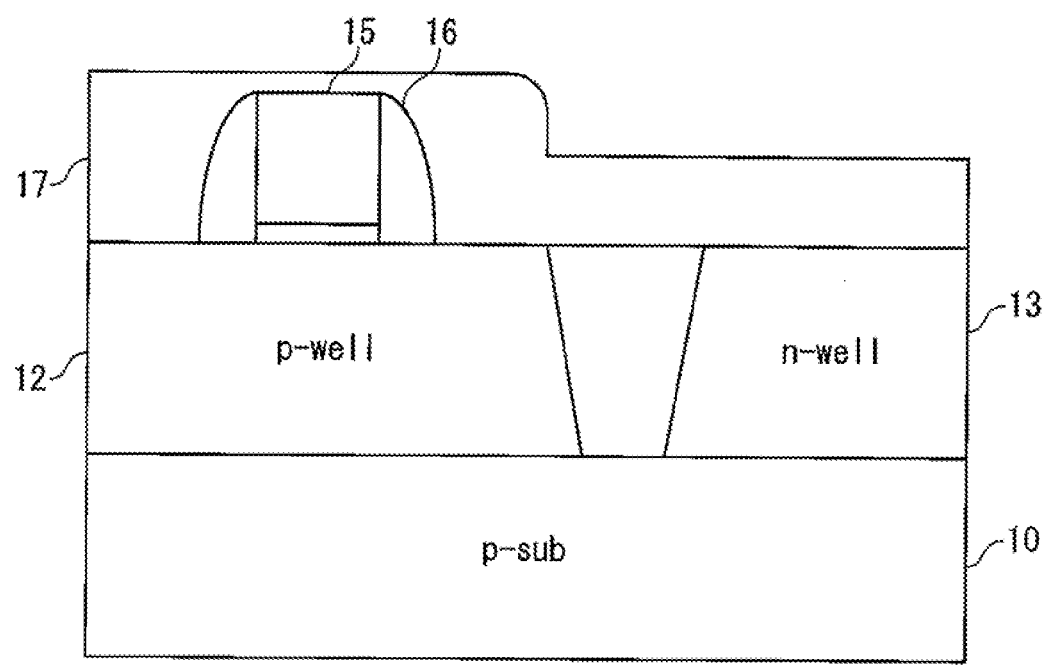

Then, as illustrated in FIG. 7, a magnetic layer 17 about 10 nm thick, such as a $(CoFe)_{80}P_{20}$ film, is deposited so as to come into contact with the semiconductor region 12 for forming source/drain regions of the spin MOSFET, by a sputtering method.

Figure 8:
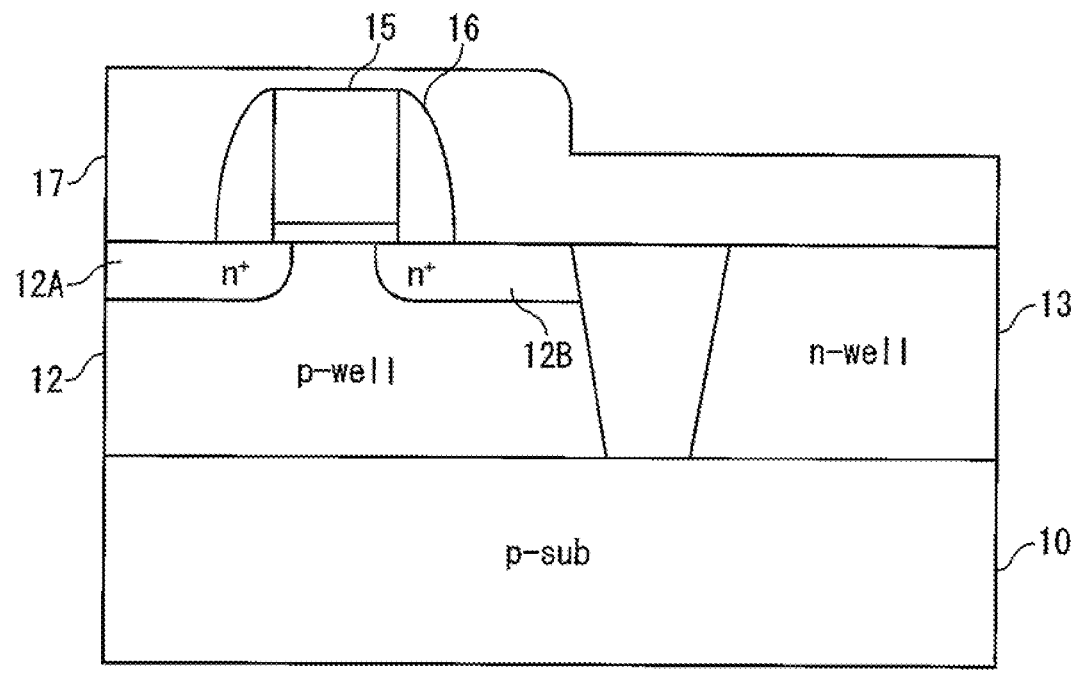

Then, as illustrated in FIG. 8, annealing at 250° C. for about 30 seconds is performed, for example, by RTA (Rapid Thermal Anneal) as a first heat treatment to diffuse phosphorus (P) of the $(COFe)_{80}P_{20}$ film from the surface into the inside of the semiconductor region 12. Consequently, n$^+$ semiconductor regions (impurity diffusion regions) 12A and 12B are formed as source/drain regions in the semiconductor region 12 under the both sides of the gate electrode 15.

It is preferable that the component ratio of Co to Fe in the $(CoFe)_{80}P_{20}$ film is 2:1 in terms of atomic ratio, and that the heat treatment is performed at a temperature lower than 300° C. in which silicidation is generally caused. By setting the temperature for heat treatment to be lower than 300° C., only diffusion of impurity elements can be caused while suppressing silicidation into CoSi, FeSi, etc.

Figure 9:
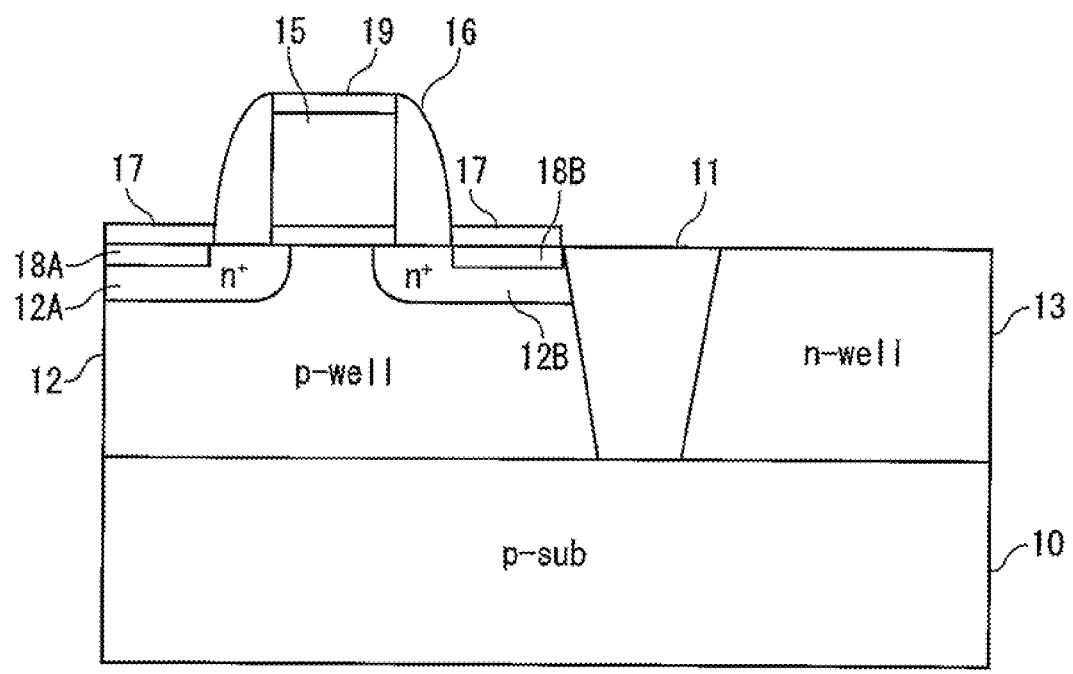

Then, annealing at 450° C. for about 30 seconds is performed by RTA as a second heat treatment to thereby make silicidation of CoFe in the $(CoFe)_{80}P_{20}$ film 17. That is, as illustrated in FIG. 9, at least one part of the $(CoFe)_{80}P_{20}$ film 17 is processed into silicide to form magnetic silicide layers 18A and 18B on the n$^+$ semiconductor regions 12A and 12B respectively. Etching back is further performed by an RIB method so that the $(CoFe)_{80}P_{20}$ film 17 is left as source/drain electrodes on the silicide layers 18A and 18B. And, on this occasion, a silicide film 19 is formed on the gate electrode 15.

By the second heat treatment, the silicidation is caused up to a depth of about 5 nm toward the Si substrate side from an interface between the n+ semiconductor region and the $(CoFe)_{80}P_{20}$ film 17. The silicide layers 18A and 18B thus formed are magnetic layers containing mixed crystal of $Co_3Si$ and $Fe_3Si$. A highly spin-polarized current can be injected into silicon from the magnetic layers. A Heusler alloy (Co$_2$FeSi) may be also formed in accordance with the component ratio of Co to Fe. Also in this case, a high spin polarization is provided.

That is, the magnetic silicide layers 18A and 18B are formed to be in contact with silicon, and the magnetic layer 17 left not silicided is located on each of the magnetic silicide layers 18A and 18B. The spin polarization of each of the magnetic silicide layers 18A and 18B is higher than that of the (CoFe)$_{80}$P$_{20}$ film (magnetic layer) 17.

In the spin MOSFET according to this embodiment, an interface layer between the n$^+$ semiconductor region 12A (12B) and the magnetic silicide layer 18A (18B) has a high concentration of phosphorus (P). For example, the concentration of phosphorus (P) is $4\times10^{19}$ to $4\times10^{21}$ atoms/cm$^3$.

Thus, an n-type spin MOSFET is produced as illustrated in FIG. 9. Although a gate-first process in which a gate portion (the gate insulating film 14 and the gate electrode 15) is formed before source/drain regions 12A and 12B are formed is exemplified, a gate-last process in which a gate portion is formed after source/drain regions are formed may be used. In the gate-last process, a dummy gate is formed in a gate forming portion, source/drain regions are formed, and then the dummy gate is removed so that a gate portion is formed.

The order of the first heat treatment (low temperature) and the second heat treatment (high temperature) may be reversed or the number of heat treatments may be reduced to one. Even in these cases, the process condition can be optimized to form a magnetic silicide layer having a high spin polarization. The semiconductor substrate is not limited to silicon and another semiconductor substrate such as a semiconductor substrate of germanium (Ge) or mixed crystal of Si and Ge may be used.

A structure using MTJ for facilitating spin-injection writing may be used in either or both of the source and the drain. A tunnel insulating film may be provided between each of the source/drain electrodes and the semiconductor to improve spin-injection efficiency. The manufacturer may suitably adapt there options in accordance with design specification.

The configuration and operation of a CAM using the above-mentioned spin MOSFET will be described below. The CAM according to this embodiment has a CAM array in which CAM cells are arranged like a matrix.

Figure 10:
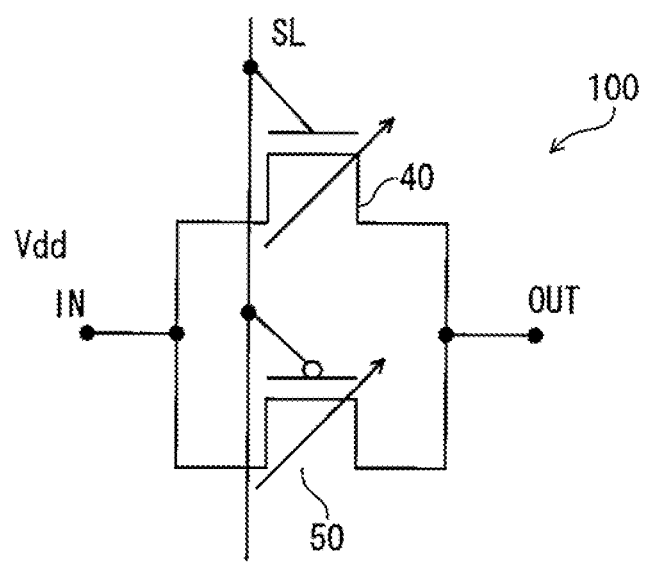
FIG. 10 illustrates t a CAM cell according to the embodiment.

FIG. 10 illustrates the configuration of a CAM cell which stores 1-bit information in the CAM according to this embodiment. As illustrated in FIG. 10, in the CAM cell 100 according to this embodiment, a pair of spin MOSFETs are connected in parallel, and gates of the pair of spin MOSFETs are connected to a search line SL. The CAM cell 100 stores 1-bit information by using the pair of spin MOSFETs. For example, the pair of spin MOSFETs are provided as a combination of an n-type spin MOSFET 40 and a p-type spin MOSFET 50 so as to operate complementarily. Respective voltage thresholds of the n-type spin MOSFET 40 and the p-type spin MOSFET 50 are controlled appropriately based on a process condition such as doping concentration, etc., thereby realizing normally-on or normally-off characteristic, as in a method of manufacturing a CMOS inverter. When a voltage signal corresponding to search data "1" is inputted to both gates of the n-type spin MOSFET 40 and the p-type spin MOSFET 50 by a control circuit not shown, only the n-type spin MOSFET 40 is turned ON but the p-type spin MOSFET 50 is turned OFF. On the other hand, when a voltage signal corresponding to search data "0" is inputted, only the p-type spin MOSFET 50 is turned ON but the n-type spin MOSFET 40 is turned OFF.

In the pair of spin MOSFETs, magnetization information corresponding to data to be stored is written in the n-type spin MOSFET 40 and magnetization information complementary to the magnetization information stored in the n-type spin MOSFET 40 is written in the p-type spin MOSFET 50. That is, magnetization information of anti-parallel magnetization is written in the p-type spin MOSFET 50 if magnetization information of parallel magnetization is written in the n-type spin MOSFET 40, or magnetization information of parallel magnetization is written in the p-type spin MOSFET 50 if magnetization information of anti-parallel magnetization is written in the n-type spin MOSFET 40. In this embodiment, stored data when magnetization information of parallel magnetization is written in the n-type spin MOSFET 40 (when magnetization information of anti-parallel magnetization is written in the p-type spin MOSFET 50) is regarded as "1". On the other hand, stored data when magnetization information of anti-parallel magnetization is written in the n-type spin MOSFET 40 (when magnetization information of parallel magnetization is written in the p-type spin MOSFET 50) is regarded as "0".

In TCAM (Ternary CAM), the contents of search data are constituted by three values of "1", "0" and "Don't Care", and when stored data is "Don't Care", magnetization information of parallel magnetization is written in both the n-type spin MOSFET 40 and the p-type spin MOSFET 50.

Operation of the pair of spin MOSFETs illustrated in FIG. 10 will be described with reference to FIGS. 11 and 12. When data stored in the CAM cell 100 is set to be "1", the n-type spin MOSFET 40 is brought into a parallel magnetization state ("P" in FIG. 11) and the p-type spin MOSFET 50 is brought into an anti-parallel magnetization state ("AP" in FIG. 11). When search data is "1", a voltage signal "1" is inputted into both gates of the pair of spin MOSFETs, and a drive voltage VDD is applied to IN so that a current flows from IN to OUT. As a result, the n-type spin MOSFET 40 (parallel magnetized spin MOSFET) becomes electrically conductive to allow a current flow. On the other hand, when search data is "0", a voltage signal "0" is inputted into both gates of the pair of spin MOSFETs and a drive voltage VDD is applied to IN so that a current flows from IN to OUT. As a result, the p-type spin MOSFET 50 (anti-parallel magnetized spin MOSFET) becomes electrically conductive to allow a current flow.

When data stored in the CAM cell is set to be "0", the n-type spin MOSFET 40 is brought into an anti-parallel magnetization state and the p-type spin MOSFET 50 is brought into a parallel magnetization state. When search data is "1", a voltage signal "1" is inputted into both gates of the pair of spin MOSFETs and a drive voltage VDD is applied to IN so that a current flows from IN to OUT. As a result, the n-type spin MOSFET 40 (anti-parallel magnetized spin MOSFET) becomes electrically conductive. On the other hand, when search data is "0", a voltage signal "0" is inputted into both gates of the pair of spin MOSFETs and a drive voltage VDD is applied to IN so that a current flows from IN to OUT. As a result, the p-type spin MOSFET 50 (parallel magnetized spin MOSFET) becomes electrically conductive.

When data stored in the CAM cell is set to be "Don't Care", the n-type spin MOSFET 40 is brought into a parallel magnetization state and the p-type spin MOSFET 50 is brought into a parallel magnetization state. Consequently, one of the parallel magnetized spin MOSFETs becomes electrically conductive since the n-type spin MOSFET 40 becomes electrically conductive when a voltage signal "1" is inputted into both gates of the pair of spin MOSFETs and the p-type spin MOSFET 50 becomes electrically conductive when a voltage signal "0" inputted into both gates of the pair of spin MOSFETs.

That is, in the CAM cell, a current flows in the parallel magnetized spin MOSFET when search data matches with stored data, but a current flows in the anti-parallel magnetized spin MOSFET when search data mismatches with stored data.

Such operation of the CAM cell corresponds to outputting the exclusive logical sum (XOR) of stored data and search data. FIG. 12 illustrates the case where stored data S and search data C match with each other and the case where stored data S and search data C mismatch with each other. An operation of setting data stored in the CAM cell as "Don't Care" is equivalent to an operation of outputting search data C and a reversed value C' thereof as "1".

Figure 13:
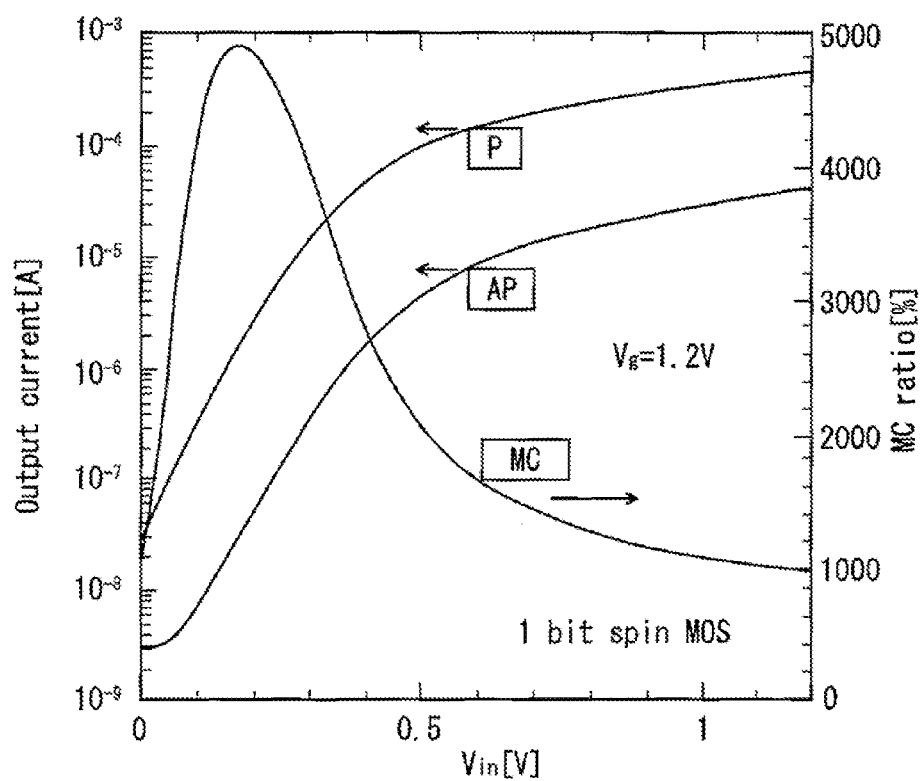
FIGS. 13 and 14 illustrate an output current of the spin MOSFET according to whether the magnetization directions thereof are parallel or anti-parallel.
Figure 14:
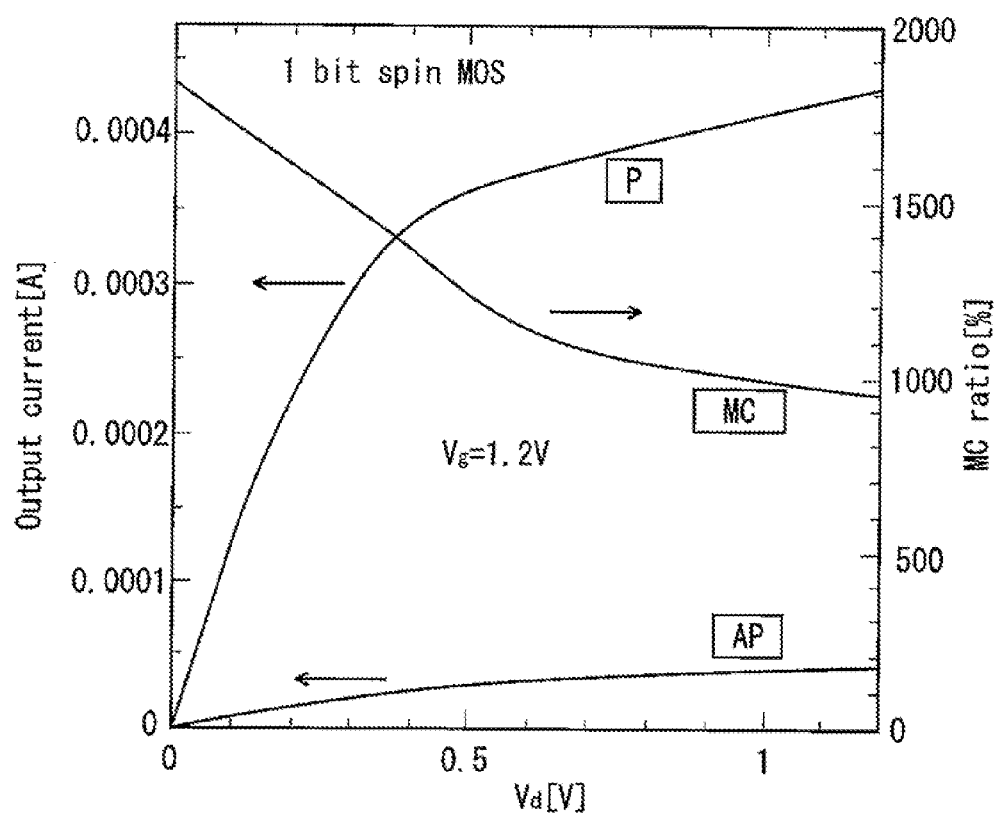

FIGS. 13 and 14 illustrate an output current when a current flows in the parallel magnetized spin MOSFET and an output current when a current flows in the anti-parallel magnetized spin MOSFET. FIGS. 13 and 14 also illustrate a magnetocurrent ratio (MC ratio) expressing the ratio of an output current when a current flows in the parallel magnetized spin MOSFET to an output current when a current flows in the anti-parallel magnetized spin MOSFET. As illustrated in FIGS. 13 and 14, when a current flows in the parallel magnetized spin MOSFET, resistance is low and the current flowing in OUT is large compared with these in the case where a current flows in the anti-parallel magnetized spin MOSFET. As a result, by comparing the current flowing in OUT with a predetermined threshold, determination can be made as to whether stored data and search data match with each other or not.

Figure 15:
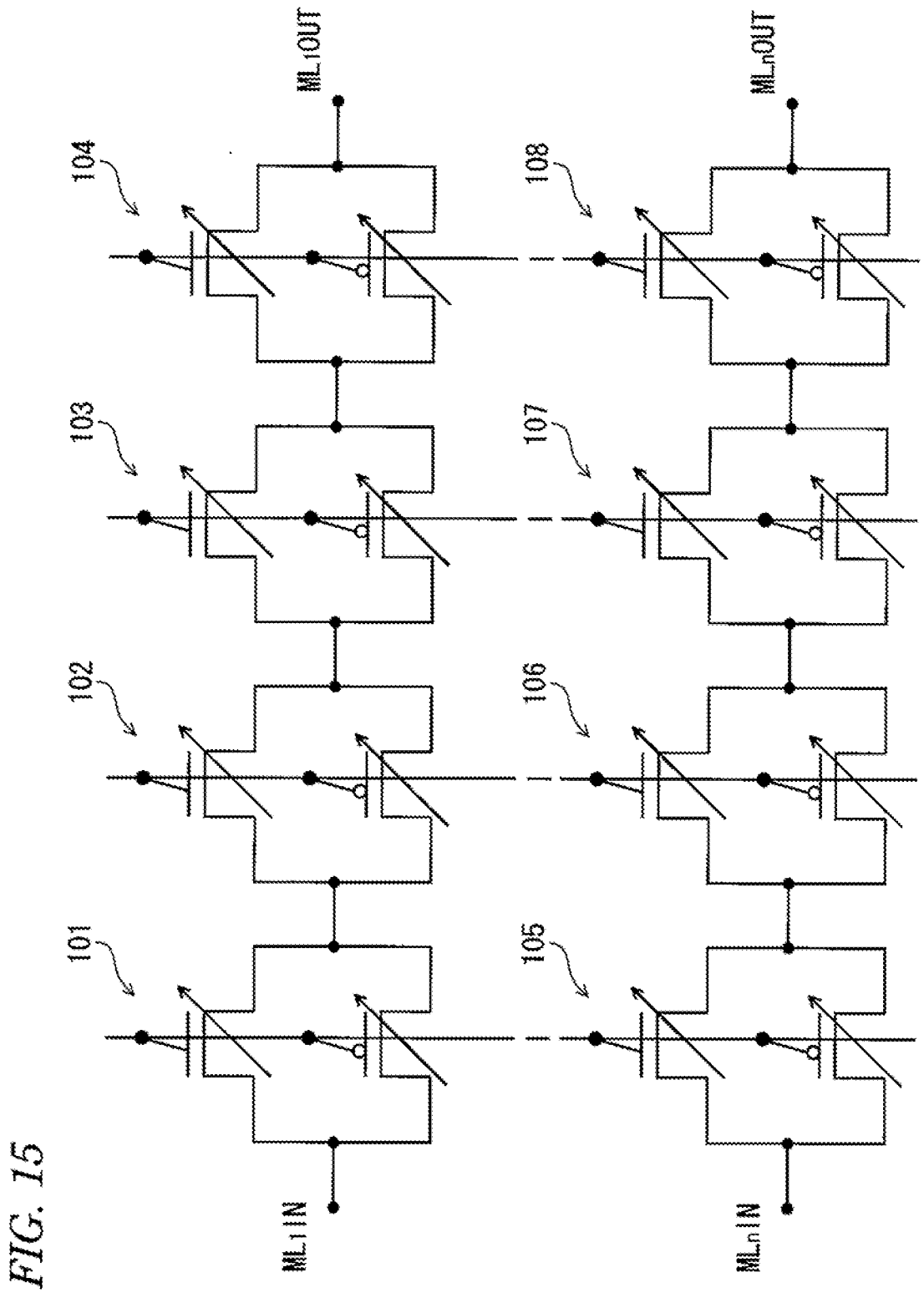
FIG. 15 illustrates a CAM array according to the embodiment.

FIG. 15 illustrates the configuration of a CAM array according to this embodiment. In this embodiment, for example, one word of search data is composed of 4 bits. The CAM array illustrated in FIG. 15 has a number (n) of words not smaller than the number of searchable data stored in the CAM array. One pair of spin MOSFETs form 1 bit. While pairs of spin MOSFETs corresponding to one word (4 bits in this example) are connected in series, FIG. 15 illustrates two words for the sake of simplification. While FIG. 15 illustrates the case where S and D of each spin MOS are connected in series, a terminal for measuring the voltage of the substrate for defining the gate voltage may be provided.

In the CAM array according to this embodiment, when searching data, a drive voltage VDD is applied to ML(n)IN to make a current flow from ML(n)TN to ML(n)OUT to thereby make determination based on the current flowing in ML(n)OUT as to whether search data matches with information stored in word ML(n) or not.

Figure 16:
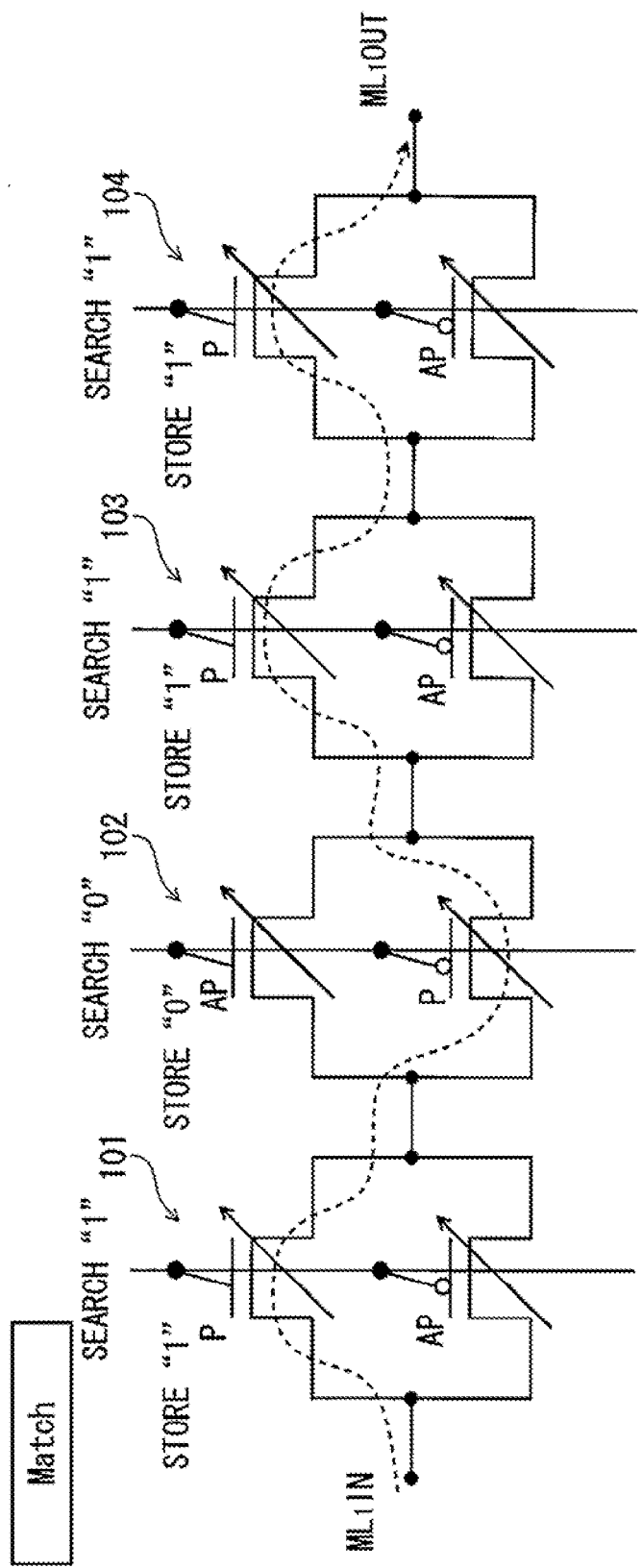
FIGS. 16 to 18 illustrate searching using a CAM according to the embodiment.

Search using the CAM according to this embodiment will be described with reference to FIGS. 16 to 18. FIG. 16 illustrates an example of search in the case where stored data and search data match with each other. As illustrated in FIG. 16, in CAM cells corresponding to one word, a CAM cell 101 forming a first bit stores "1" (the n-type spin MOSFET is parallel magnetized, and the p-type spin MOSFET is anti-parallel magnetized). A CAM cell 102 forming a second bit stores "0" (the n-type spin MOSFET is anti-parallel magnetized, and the p-type spin MOSFET is parallel magnetized). A CAM cell 103 forming a third bit stores "1" (the n-type spin MOSFET is parallel magnetized, and the p-type spin MOSFET is anti-parallel magnetized). A CAM cell 104 forming a fourth bit stores "1" (the n-type spin MOSFET is parallel magnetized, and the p-type spin MOSFET is anti-parallel magnetized). In this state, stored data is collated with search data "1011". That is, a voltage signal "1" is inputted into both gates of the n-type spin MOSFET and the p-type spin MOSFET in the first-bit CAM cell 101, a voltage signal "0" is inputted into both gates in the second-bit CAM cell 102, a voltage signal "1" is inputted into both gates in the third-bit CAM cell 103, and a voltage signal "1" is inputted into both gates in the fourth-bit CAM cell 104.

Consequently, in the first-bit CAM cell 101, the n-type spin MOSFET is turned ON and the p-type spin MOSFET is turned OFF. In the second-bit CAM cell 102, the n-type spin MOSFET is turned OFF and the p-type spin MOSFET is turned ON. In the third-bit CAM cell 103, the n-type spin MOSFET is turned ON and the p-type spin MOSFET is turned OFF. In the fourth-bit CAM cell 104, the n-type spin MOSFET is turned ON and the p-type spin MOSFET is turned OFF. As a result, a current flows in all parallel magnetized spin MOSFETs of the first to fourth bits.

Figure 17:
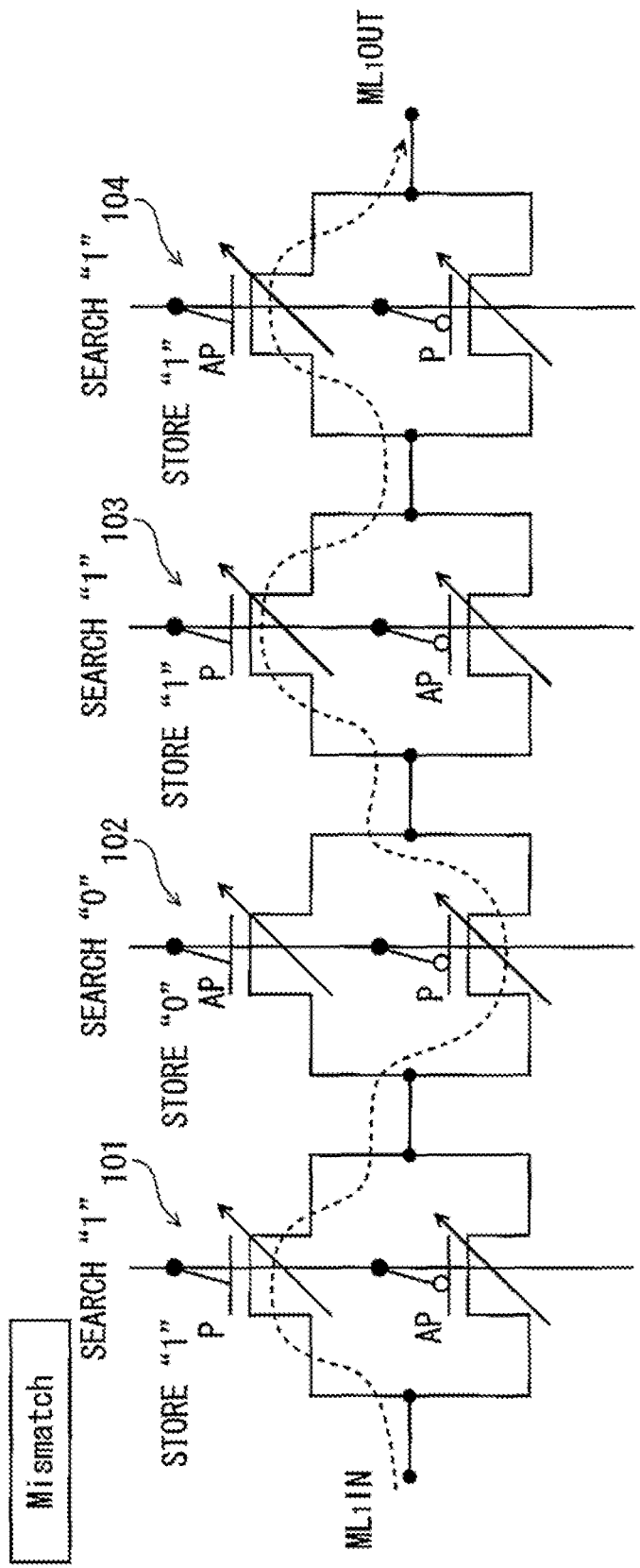

On the other hand, FIG. 17 illustrates an example of search in the case where stored data and search data mismatch with each other. As illustrated in FIG. 17, in the CAM cells corresponding to one word, stored data is "1010" and search data is "1011". In the case, data stored in the fourth-bit CAM cell 104 is "0", that is, the n-type spin MOSFET is anti-parallel magnetized while the p-type spin MOSFET is parallel magnetized. On the other hand, a voltage signal "1" is inputted into both gates in the fourth-bit CAM cell 104 so that the n-type spin MOSFET which is anti-parallel magnetized is turned ON. As a result, a current flows in the anti-parallel magnetized spin MOSFET in the forth-bit CAM cell 104 where a mismatch exists.

In this manner, a current flows in all parallel magnetized spin MOSFETs when stored data and search data match with each other, but a current flows in at least one anti-parallel magnetized spin MOSFET when stored data and search data mismatch with each other with respect to at least one bit. As a result, when stored data and search data match with each other, the output current is high compared with the case where stored data and search data mismatch with each other. In other words, resistance is low.

Figure 19:
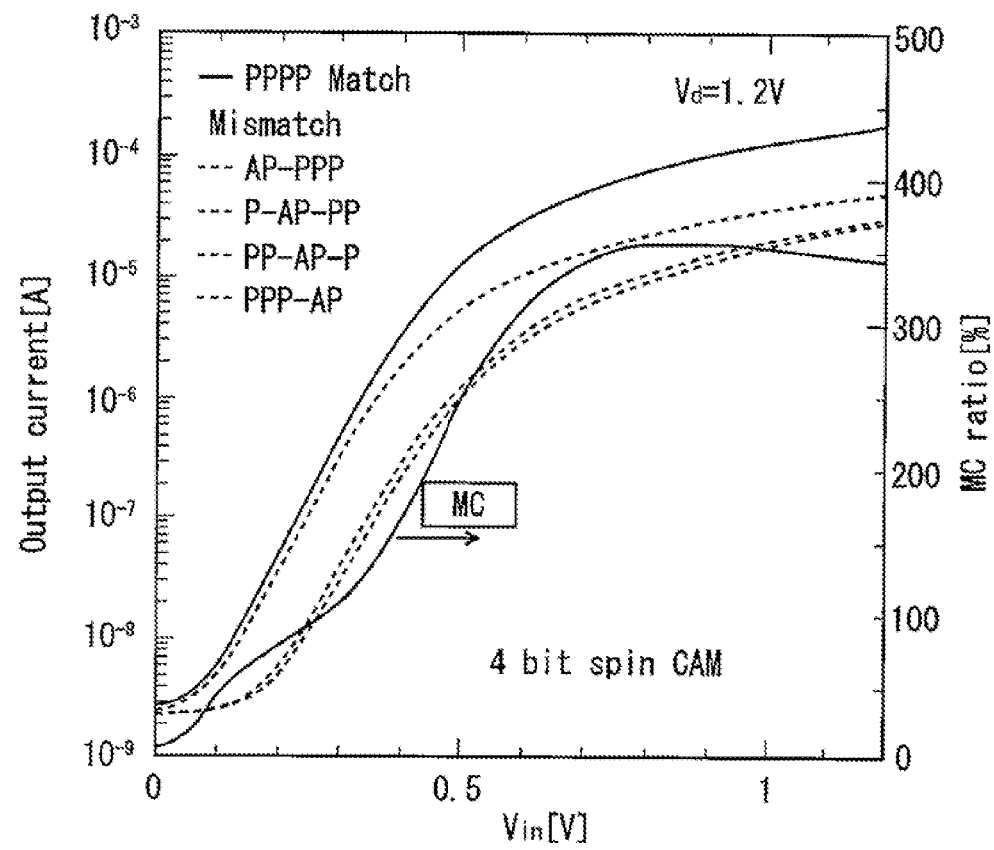
FIGS. 19 and 20 illustrate characteristic of a four-bit CAM cell.
Figure 20:
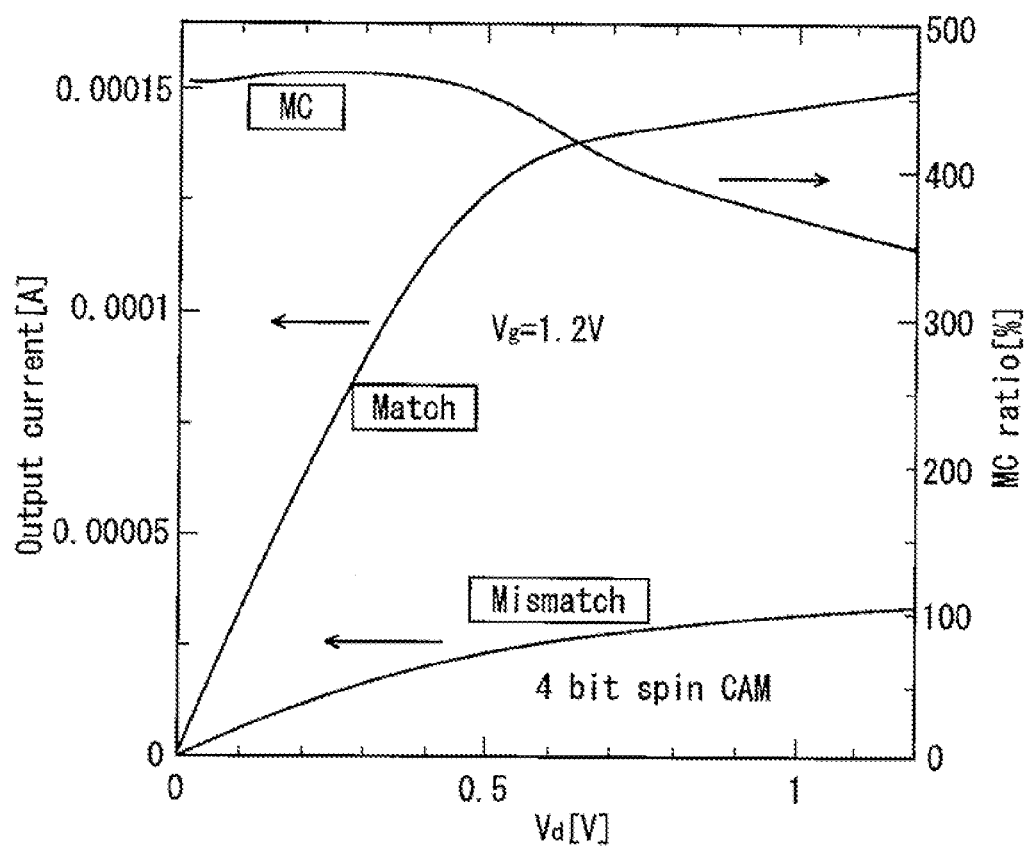

FIGS. 19 and 20 illustrate an output current in the case where a current flows in all parallel magnetized spin MOSFETs corresponding to 4 bits, and an output current in the case where a current flows in an anti-parallel magnetized spin MOSFET corresponding to one of 4 bits and a current flows in parallel magnetized spin MOSFETs corresponding to the residual 3 bits. FIGS. 19 and 20 also illustrate magnetocurrent ratios.

Figure 21:
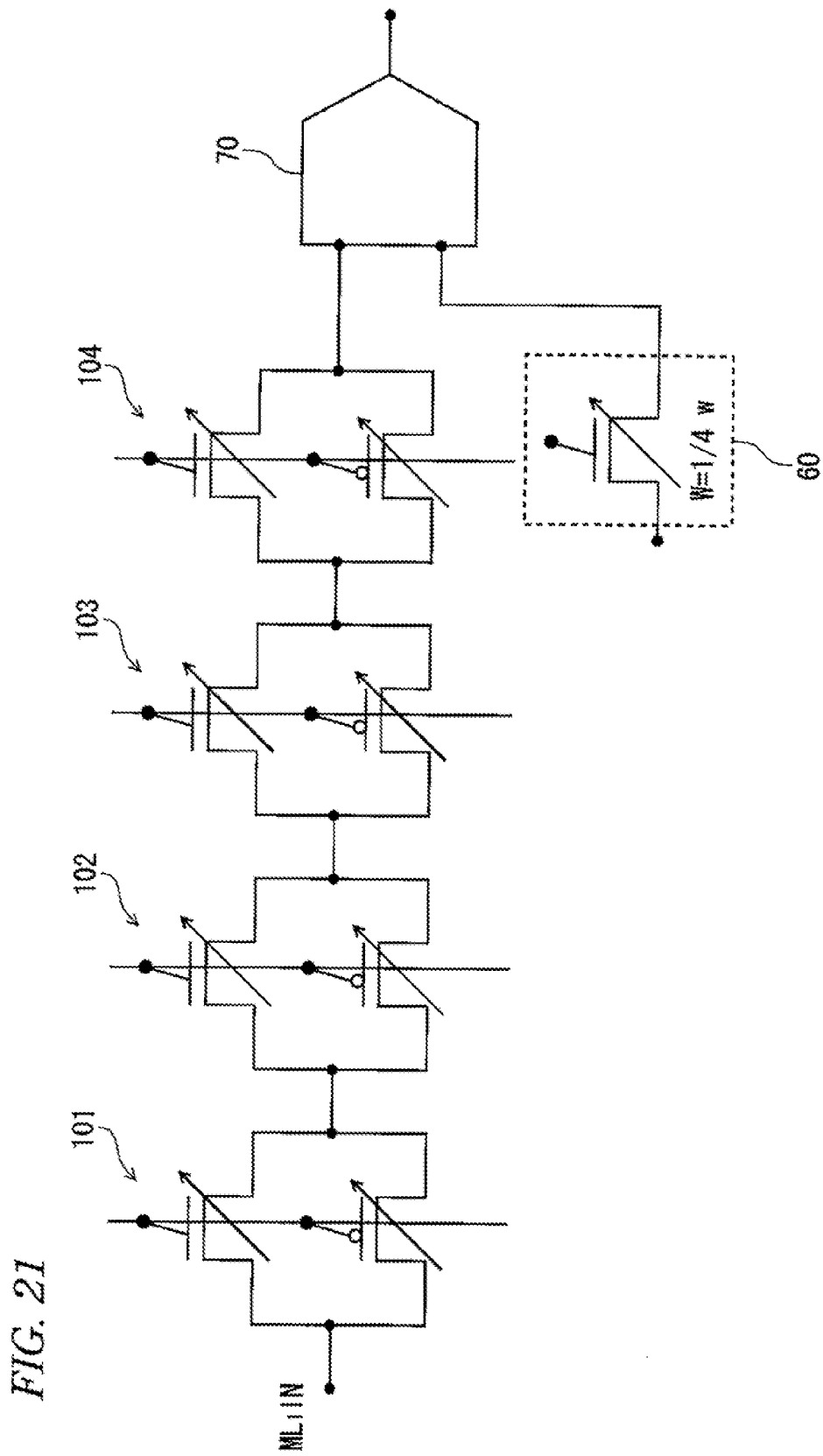
FIG. 21 illustrates a part of a CAM array according to the embodiment.

As illustrated in FIGS. 19 and 20, there is a difference between the output current which flows only in the parallel magnetized spin MOSFETs and the output current which flows also in at least one anti-parallel magnetized spin MOSFET. Therefore, hitting can be determined based on comparison of these currents, for example, by providing a reference cell equivalent to all matching. Such reference cell may be formed from a transistor having resistance at parallel magnetization. For example, as illustrated in FIG. 21, a comparator 70 and a reference cell 60 may be provided. For example, the output current from the CAM cell 104 is inputted into the comparator 70 to be converted into a voltage, and the voltage is compared with a voltage of a signal outputted from the reference cell 60. The reference cell 60 and the comparator 70 are not limited to the form illustrated in FIG. 21 but may be modified variously. For example, as for the reference cell, instead of using only one transistor, plural transistors of the number of the search bit row may be used. As for the comparator, a general OP amplifier without the negative feedback may be used.

Figure 18:
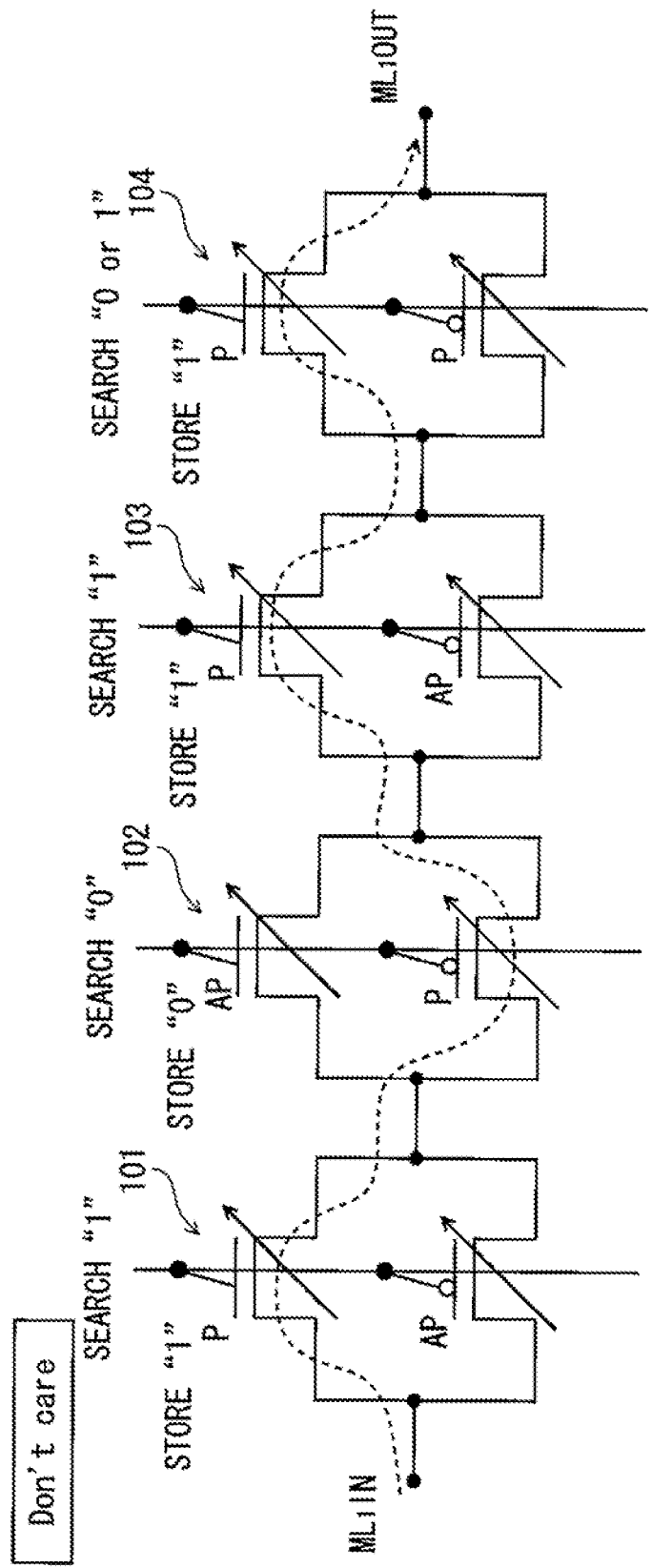

FIG. 18 illustrates an example of search in the case where there is a "Don't Care" bit. As illustrated in FIG. 18, in CAM cells corresponding to one word, data stored in the fourth-bit CAM cell 104 is "Don't Care". Both the n-type spin MOSFET and the p-type spin MOSFET in the CAM cell 104 are parallel magnetized. On this occasion, a current flows in all parallel magnetized spin MOSFETs regardless of whether search data is "1010" or whether search data is "1011". As a result, whether search data and stored data match with each other or not, can be determined regardless of the fourth bit of search data.

Although there is exemplified the case where the n-type spin MOSFET is parallel magnetized while the p-type spin MOSFET is anti-parallel magnetized when stored data is set to be "1" so that the n-type spin MOSFET is turned ON when search data is "1", the invention is not limited thereto. For example, the p-type spin MOSFET may be parallel magnetized when stored data is set to be "1" so that the p-type spin MOSFET is turned ON when search data is "1". Configuration may be made so that a current flows in all anti-parallel magnetized spin MOSFETs when search data and stored data match with each other with respect to all bits, but a current flows in at least one parallel magnetized spin MOSFET when search data and stored data match with each other with respect to at least one bit. That is, when stored data is "1" or "0", one of the pair of spin MOSFETs is parallel magnetized while the other is anti-parallel magnetized at data storage time in accordance with whether the stored data is "1" or "0". At search time, the pair of spin MOSFETs may operate so that one of the pair of spin MOSFETs becomes electrically conductive and the other becomes electrically nonconductive in accordance a voltage applied to the gate electrode.

Figure 22:
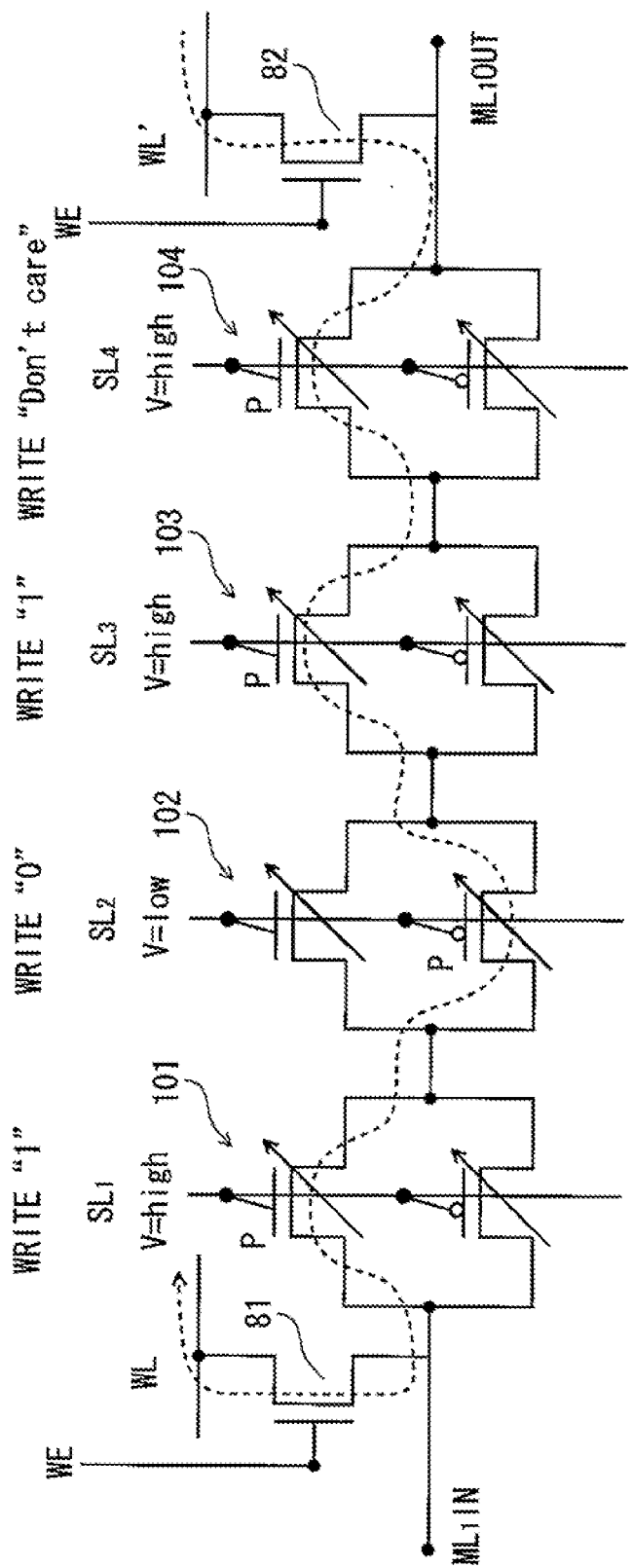
FIGS. 22 to 25 illustrate writing using a CAM according to the embodiment.
Figure 23:
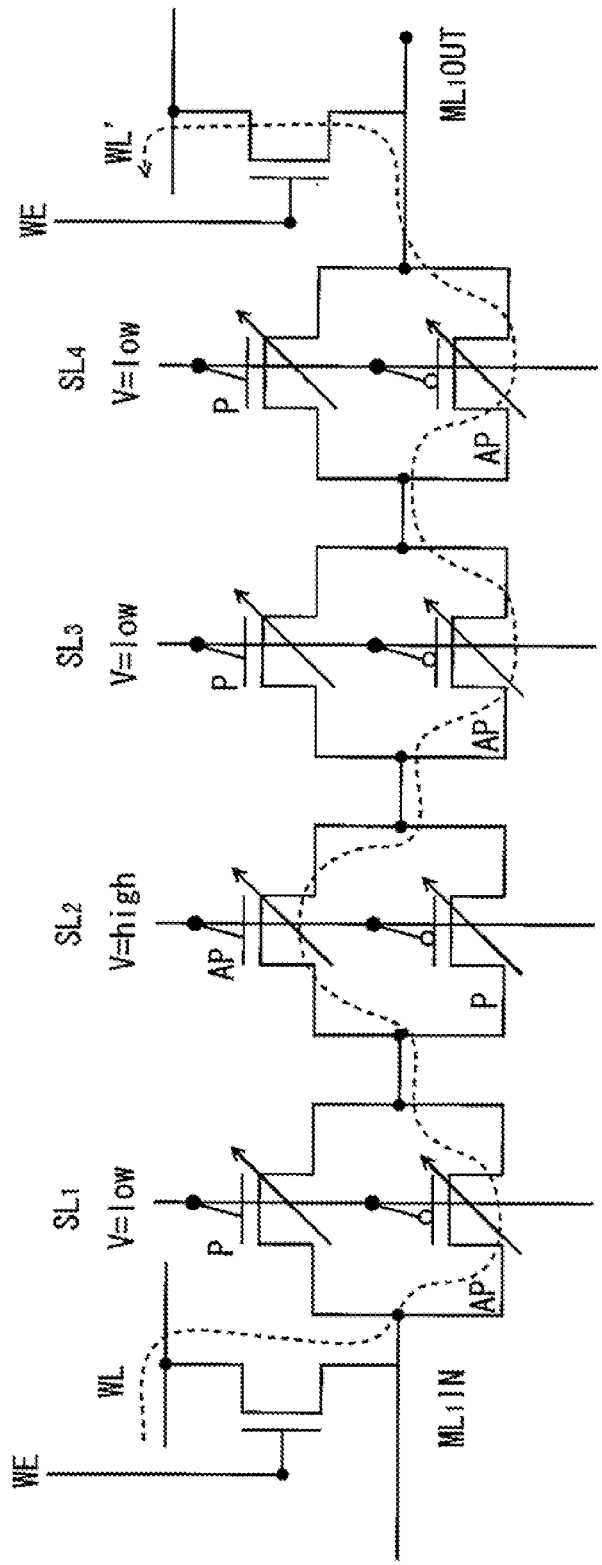
Figure 24:
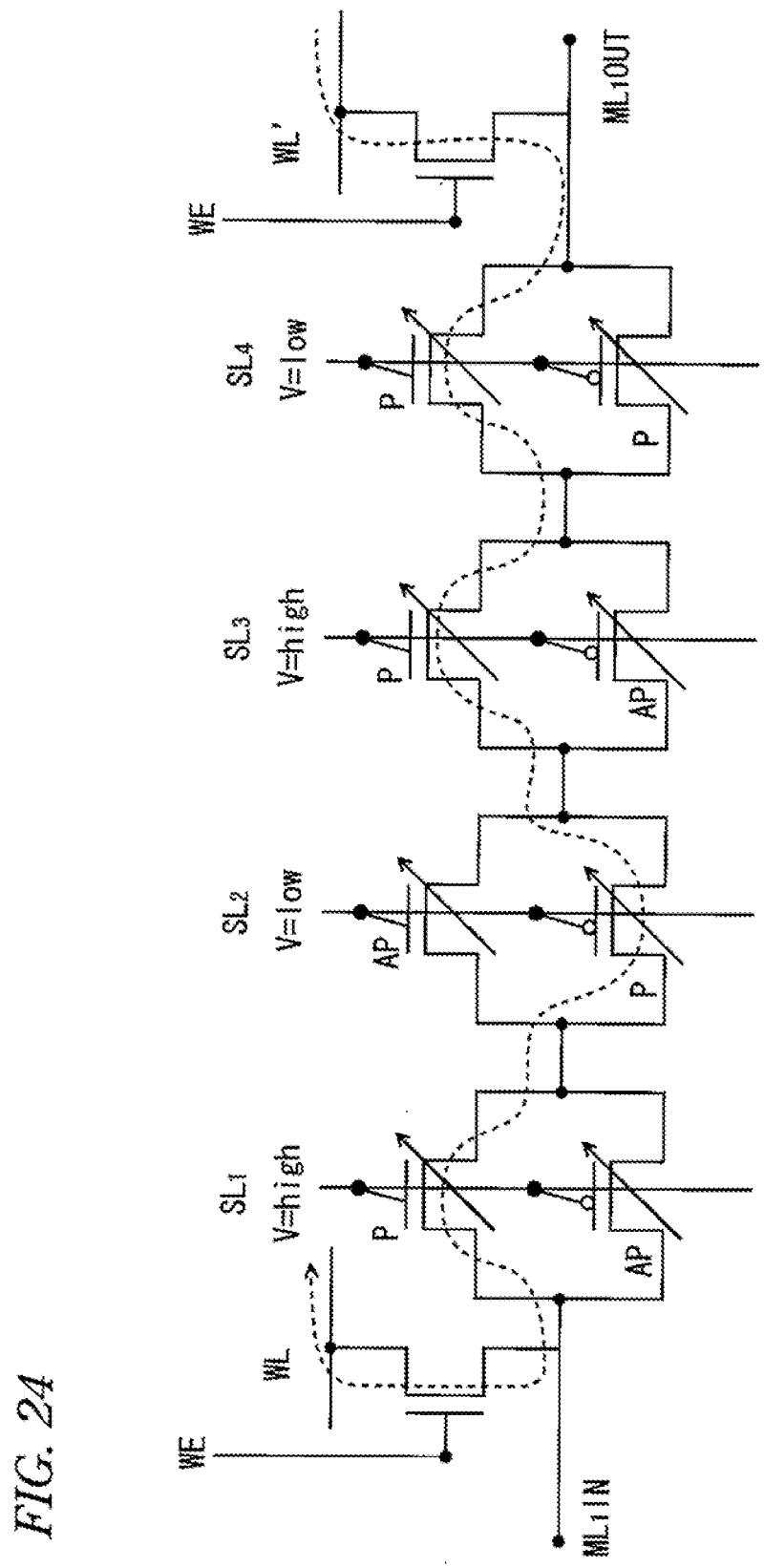

Writing stored data into the CAM according to this embodiment will be described below with reference to FIGS. 22 to 24. Stored data are written in a unit of one word. In a BCAM (Binary CAM), in which contents of search data are expressed in two values of "1" and "0", stored data are written by two steps. In a TCAM, stored data are written by three steps. In the following description, the case where 4 bits of "1", "0", "1" and "Don't care" are written is exemplified. As illustrated in FIGS. 22 to 24, the CAM according to this embodiment has pass transistors 81 and 82 every word for selecting the word to be written.

FIG. 22 illustrates a first step for writing stored data. First, a gate voltage with a sufficiently larger value than that at data read time is given to a pair of spin MOSFETs to be subjected to writing. On this occasion, a gate voltage with a sufficiently large positive value is given to a CAM cell in which data to be stored is "1" or "Don't care" so that the n-type spin MOSFET is turned ON. A gate voltage with a sufficiently large negative value is given to a CAM cell in which data to be stored is "0" so that the p-type spin MOSFET is turned ON.

Figure 25:
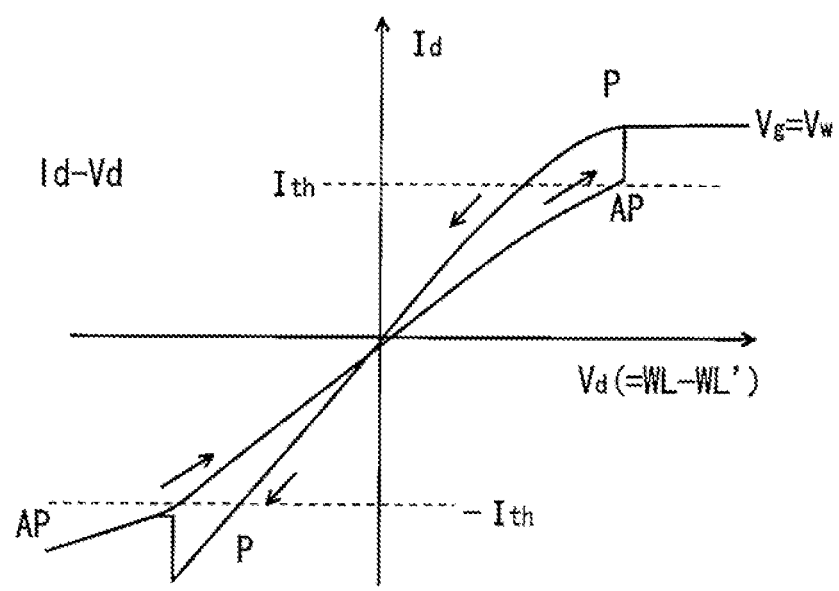

Then, a control circuit not shown increases WE to turn ON the pass transistors 81 and 82 to pass a current from WL to WL' or from WL' to WL to write magnetization information based on spin injection magnetization reversal (as to the spin injection magnetization reversal, for example, see JP-2010-074001-A). FIG. 25 illustrates write characteristic of a spin MOSFET. As illustrated in FIG. 25, magnetization information changes from anti-parallel magnetization to parallel magnetization when a current with a positive value not smaller than $I_{th}$ flows in the spin MOSFET. Magnetization information changes from parallel magnetization to anti-parallel magnetization when a current with a negative value not smaller than $I_{th}$ flows in the spin MOSFET.

The reason why a sufficiently larger gate voltage is given to the CAM cell at data write time than at data read time is to increase an operating margin between the data read time and the data write time. For example, when the write gate voltage is, for example, not smaller than 2 V, a large current not smaller than $I_{th}$ necessary for occurrence of spin injection magnetization reversal cannot be obtained. Thus, by setting a read gate voltage to be small, for example, to be not larger than 1 V, at data read time, while data can be read at a small current, erroneous data writing can be prevented.

In this embodiment, it is defined that magnetization information changes from parallel magnetization to anti-parallel magnetization when a current is passed from WL to WL', and magnetization information changes from anti-parallel magnetization to parallel magnetization when a current is passed from WL' to WL.

When a high voltage is applied to WL' while WL is connected to GND, a current not smaller than $I_{th}$ flows from WL' to WL so that the anti-parallel magnetized spin MOSFET changes to be parallel magnetized while the parallel magnetized spin MOSFET is kept parallel magnetized. In this manner, as illustrated in FIG. 22, the n-type spin MOSFET in the first-bit CAM cell 101, the p-type spin MOSFET in the second-bit CAM cell 102, the n-type spin MOSFET in the third-bit CAM cell 103 and the n-type spin MOSFET in the fourth-bit CAM cell 104 are parallel magnetized.

Then, processing shifts to a second step as illustrated in FIG. 23. In the second step, a voltage reverse to that in the first step is applied to the gate electrode. That is, a gate voltage with a sufficiently large negative value is given to a CAM cell in which data to be stored is "1" or "Don't care" so that the p-type spin MOSFET is turned ON, whereas a gate voltage with a sufficiently large positive value is given to a CAM cell in which data to be stored is "0" so that the n-type spin MOSFET is turned ON.

When a high voltage is applied to WL while WL' is connected to GND inversely with the first step, a current not smaller than $I_{th}$ flows from WL to WL' so that the parallel magnetized spin MOSFET changes to be anti-parallel magnetized while the anti-parallel magnetized spin MOSFET is kept anti-parallel magnetized. Accordingly, as illustrated in FIG. 23, the p-type spin MOSFET in the first-bit CAM cell 101, the n-type spin MOSFET in the second-bit CAM cell 102, the p-type spin MOSFET in the third-bit CAM cell 103 and the p-type spin MOSFET in the fourth-bit CAM cell 104 are anti-parallel magnetized.

Then, processing shifts to a third step as illustrated in FIG. 24. In the third step, the same voltage as in the first step is applied to the gate electrode in a CAM cell in which data to be stored is "1" or "0" whereas a voltage reverse to that in the first step is applied to the gate electrode in a CAM cell in which data to be stored is "Don't care". That is, a gate voltage with a sufficiently large positive value is given to a CAM cell in which data to be stored is "1" so that the n-type spin MOSFET is turned ON, whereas a gate voltage with a sufficiently large negative value is given to a CAM cell in which data to be stored is "0" or "Don't care" so that the p-type spin MOSFET is turned ON.

When a high voltage is applied to WL' while WL is connected to GND, as in the first step, a current not smaller than $I_{th}$ flows from WL' to WL so that the anti-parallel magnetized spin MOSFET changes to be parallel magnetized while the parallel magnetized spin MOSFET is kept parallel magnetized. The p-type spin MOSFET in the fourth-bit CAM cell 104 is parallel magnetized. When the third step is completed, stored data of any one of "1", "0" and "Don't care" is written in each CAM cell as illustrated in FIG. 24.

Although the writing procedure has been described in the case where one spin MOSFET is parallel magnetized by the first step and the other spin MOSFET is anti-parallel magnetized by the second step, the order of the first step and the second step may be reversed. Although the n-type spin MOSFET of "Don't care" bit is parallel magnetized by the first step and the p-type spin MOSFET of "Don't care" bit is parallel magnetized by the third step, the p-type spin MOSFET may be parallel magnetized by the first step and the n-type spin MOSFET may be parallel magnetized by the third step.

In this manner, writing into the CAM can be performed by a method basically equivalent to a spin RAM write selection method and a 1-bit spin MOSFET write method is extended to a multi-bit write method, so that multi-bits in a BCAM can be written by two writing steps per word and multi-bits in a TCAM can be written by three writing steps per word.

As described above, the CAM according to this embodiment has pairs of complementarily operating spin MOSFETs connected in series. Accordingly, the CAM can operate speedily because bits can be processed concurrently compared with a CAM in which bits are read or written one by one sequentially. Moreover, a nonvolatility can be achieved by use of spin MOSFETs, and power consumption can be decreased, for example, by stopping power supply to unused memory blocks.

Since the above-mentioned CAM can be produced by only one front end process, design of the CAM can be facilitated due to the simplified wiring. For example, in comparison with a CAM having a combination of transistors and MTJs such as an MRAM type CAM which needs matching of the transistors and resistance of the MTJs, increase in resistance can be suppressed in the CAM according to this embodiment. Because the CAM according to this embodiment is so relatively small that wiring is shortened compared with the MRAM type CAM, RC delay can be suppressed so that the CAM according to this embodiment can operate more speedily.

Second Embodiment

Figure 26:
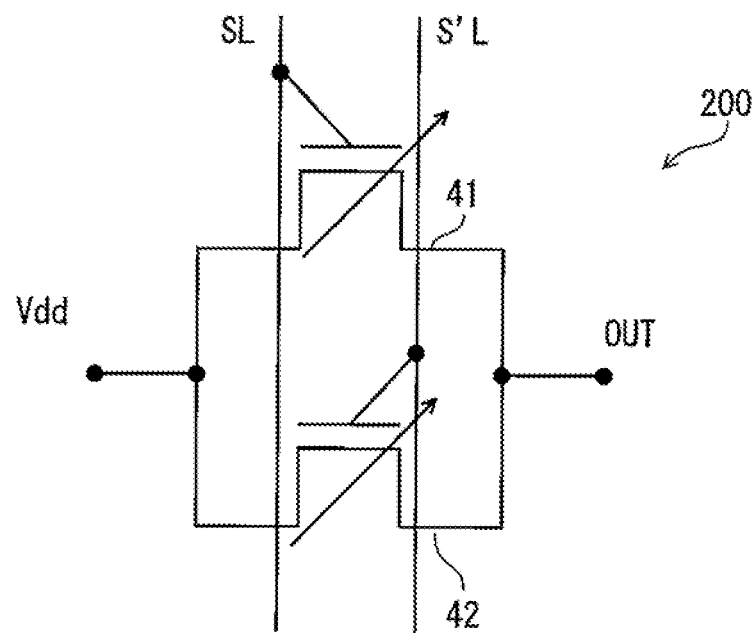
FIG. 26 illustrates a CAM array according to a second embodiment.

A second embodiment will be described below. The CAM according to this embodiment is formed from either n-type spin MOSFETs or p-type spin MOSFETs. FIG. 26 illustrates the configuration of a CAM cell which stores 1-bit information in the CAM according to the second embodiment. The CAM cell 200 according to the second embodiment includes two n-type spin MOSFETs and two search lines SL and S'L. One spin MOSFET 41 is connected to SL. The other spin MOSFET 42 is connected to S'L. S'L inputs an inverted value of SL to the spin MOSFET 42. The complementary input values of the pair of wirings SL and S'L are realized by a CMOS inverter provided therebetween. While S and D of each spin MOSFET are connected in series, a terminal for measuring the voltage of the substrate for defining the gate voltage may be provided.

In the second embodiment, the CAM cells 200 corresponding to one word are connected in series, as in the first embodiment. Because an inverted value of SL is given to the wiring S'L, the pair of spin MOSFETs operate so that when one of the spin MOSFETs is turned ON, the other spin MOSFET is turned OFF. As for magnetization information of the pair of spin MOSFETs, complementary information is written, as in the first embodiment. That is, when stored data is "1", one of the spin MOSFETs is parallel magnetized while the other spin MOSFET is anti-parallel magnetized. When stored data is "0", one of the spin MOSFETs is anti-parallel magnetized while the other spin MOSFET is parallel magnetized inversely with the case where stored data is "1". When stored data is "Don't care", both spin MOSFETs are parallel magnetized. Since a read/write method of the CAM according to this embodiment is the same as the method in the first embodiment, description thereof will be omitted.

When each CAM cell is formed from either n-type or p-type spin MOSFETs as described above, while wiring for gate input increase compared with the first embodiment, the process is simplified because it is easy to equalize the magnet current ratios (MC ratios) of the pair of spin MOSFETs.

Third Embodiment

Figure 27:
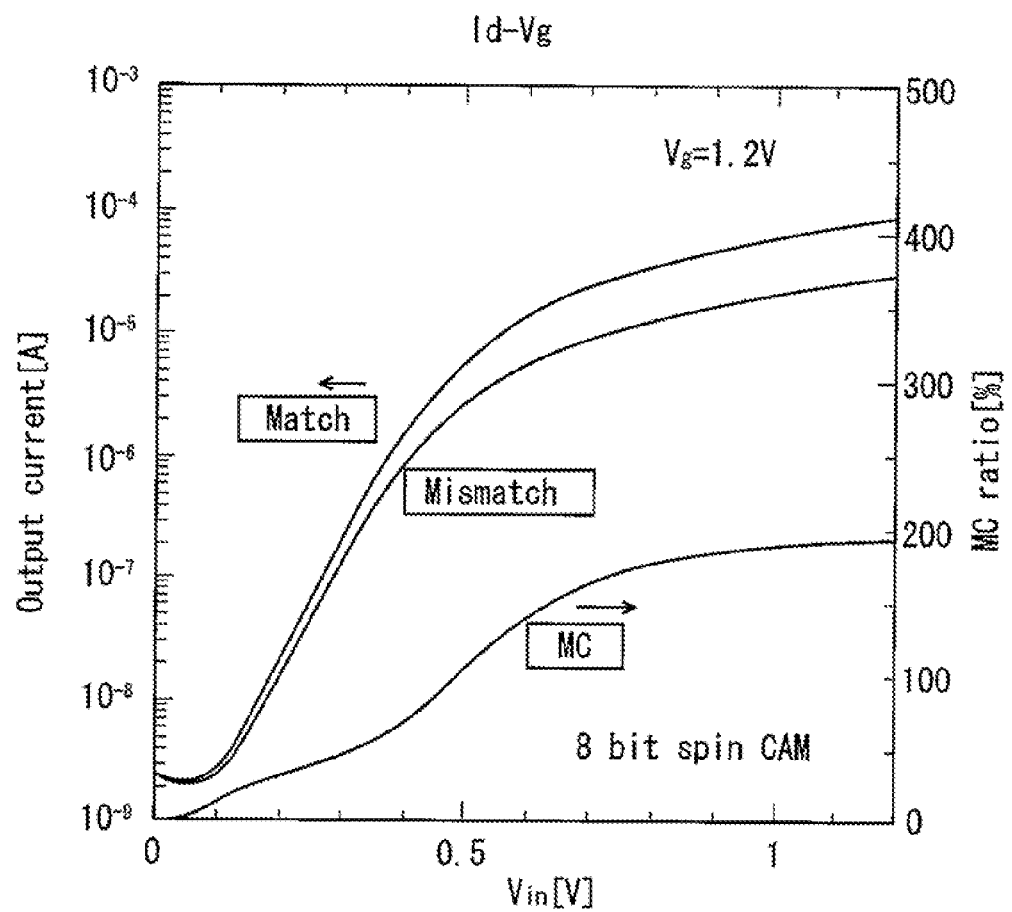
FIGS. 27 and 28 illustrate characteristic of an eight-bit CAM cell.
Figure 28:
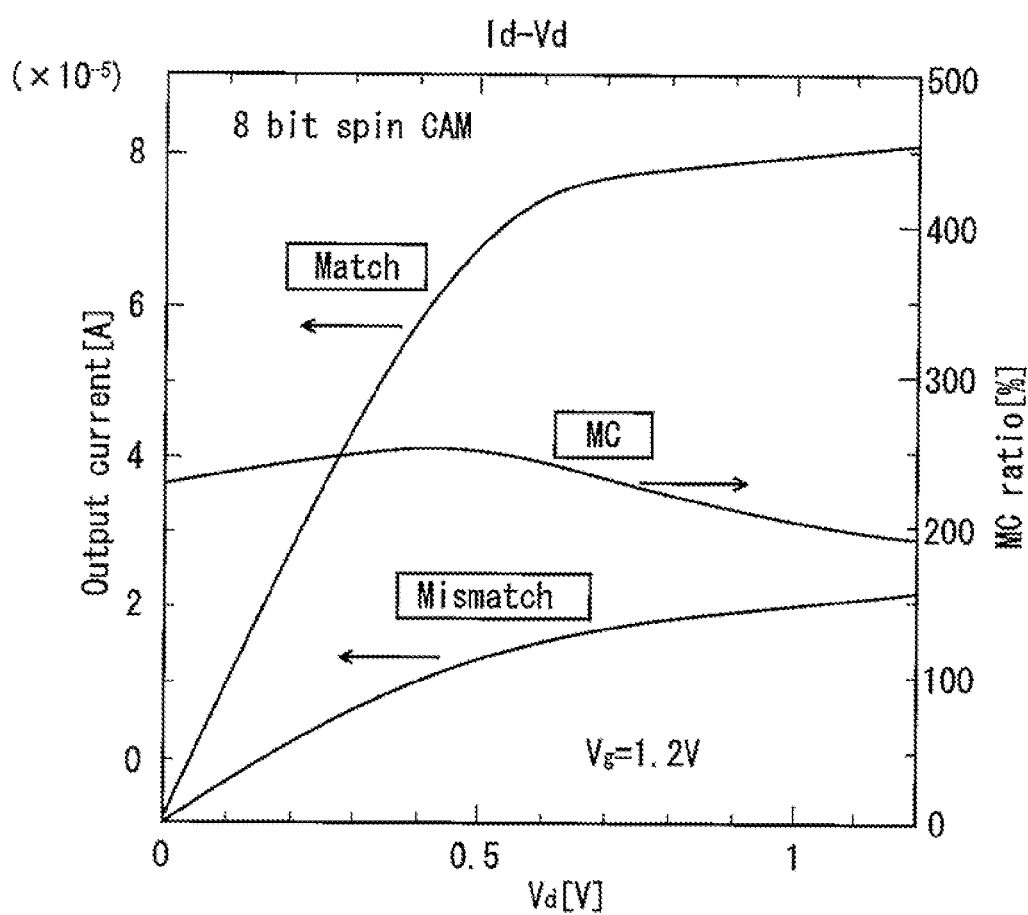
Figure 29:
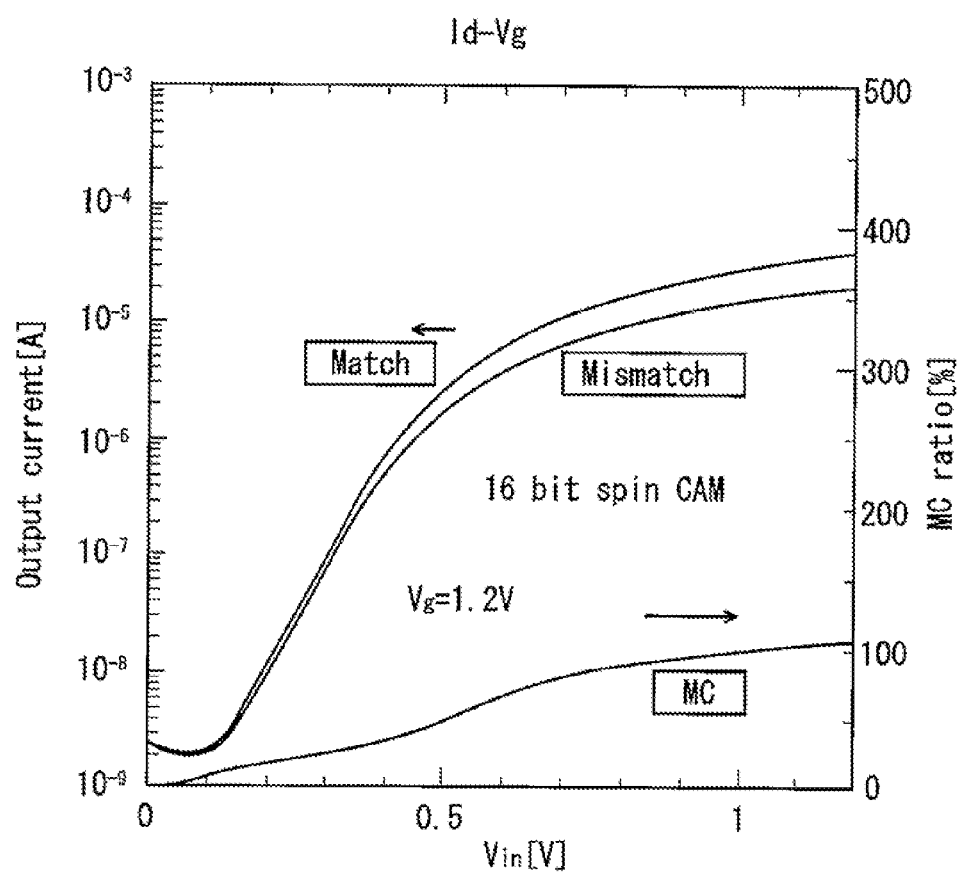
FIGS. 29 and 30 illustrate characteristic of a sixteen-bit CAM cell.
Figure 30:
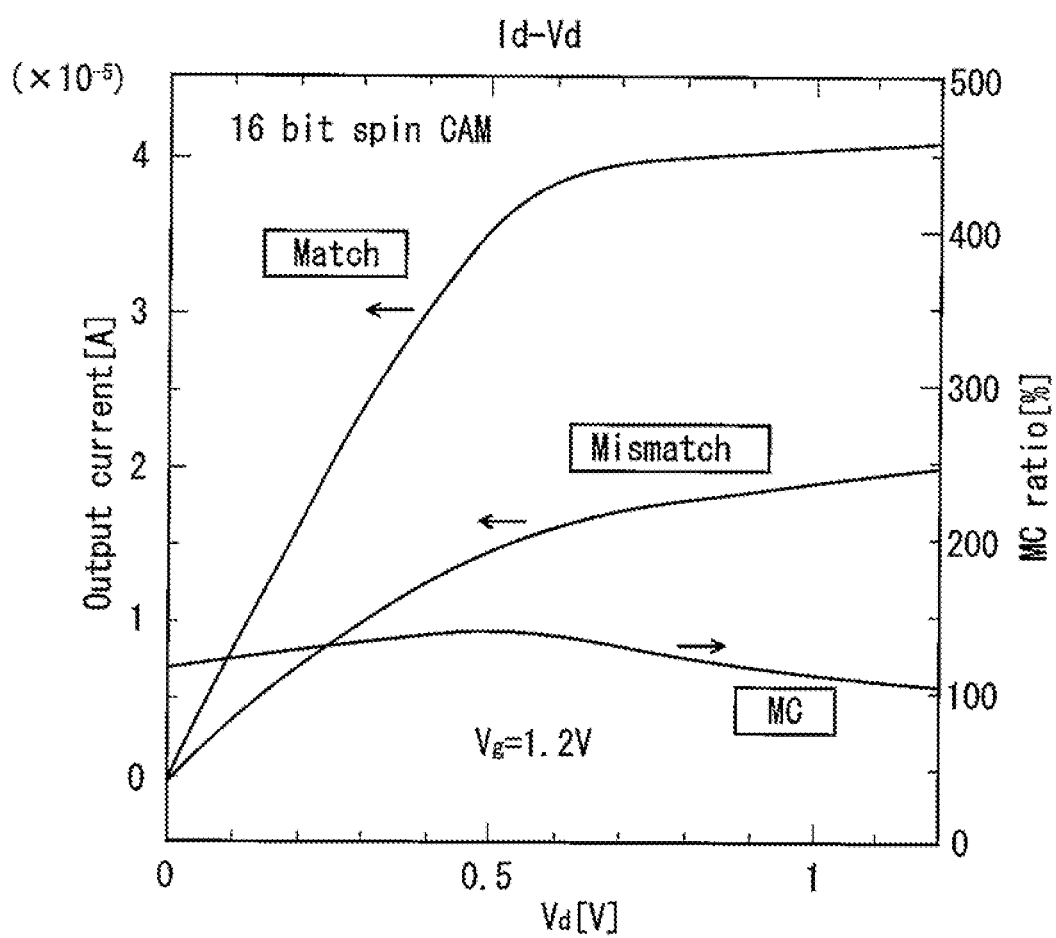
Figure 31:
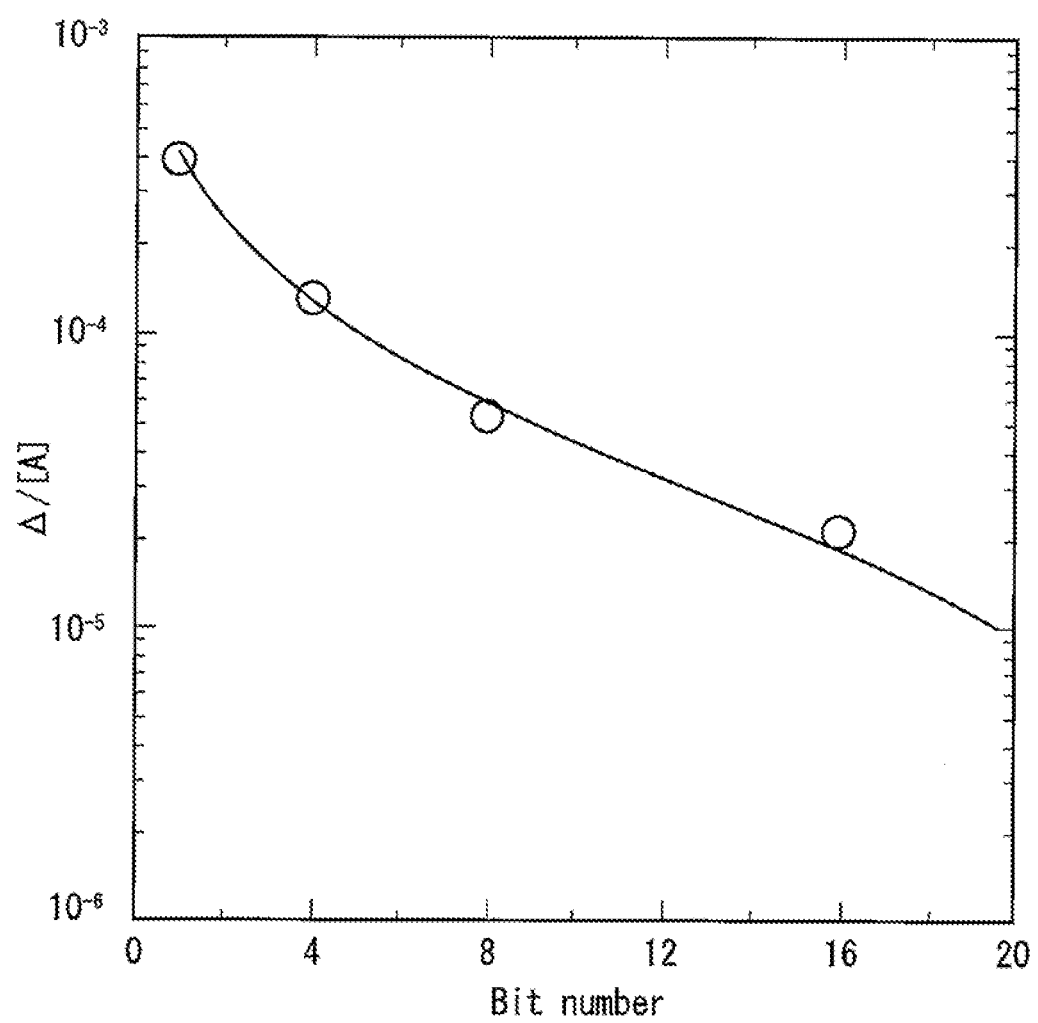
FIG. 31 illustrates the relationship between the number of bits in a CAM array and a reading current difference.

A third embodiment will be described below. This embodiment illustrates a CAM in the case where one word is larger than 4 bits. As the number of bits per word increases, the voltage of the read signal decreases. FIGS. 27 and 28 illustrate output currents and MC ratios in the case where a current flows only in parallel magnetized spin MOSFETs (in the case where search data and stored data match with each other as represented by "Match" in FIGS. 27 and 28) and in the case where a current flows also in one anti-parallel magnetized spin MOSFET (in the case where search data and stored data differ from each other by one bit as represented by "Mismatch" in FIGS. 27 and 28) in the condition that pairs of spin MOSFETs corresponding to 8 bits are connected in series. FIGS. 29 and 30 illustrate output currents and MC ratios in the case where a current flows only in parallel magnetized spin MOSFETs and in the case where a current flows also in one anti-parallel magnetized spin MOSFET in the condition that pairs of spin MOSFETs corresponding to 16 bits are connected in series. FIG. 31 illustrates the relation between the number of bits forming one word and the difference between the output current in the case where search data and stored data match with each other at reading time and the output current in the case where search data and stored data mismatch with each other by one bit at reading time. In comparison among the case where one word is 4 bits (FIGS. 19 and 20), the case where one word is 8 bits (FIGS. 27 and 28) and the case where one word is 16 bits (FIGS. 29 and 30), the difference between the output current in the case of "Match" and the output current in the case of "Mismatch" is reduced because the output current decreases as the number of bits per word increases.

Therefore, the MC ratio per one pair of spin MOSFETs is set to be high. Such a high MC ratio can be obtained, for example, by making each spin MOSFET with a short gate length or by using a magnetic electrode having a high spin polarization. Specifically, spin relaxation may be suppressed dramatically by qualitative change of a spin scattering mechanism when the gate length reaches a gate length allowing quasi-Ballistic electron transport to be achieved physically in and after 22 nm generation as a result of scaling down toward 130 nm, 90 nm, 65 nm, 45 nm, ... in accordance with CMOS scaling rules. As the highly spin polarized material, for example, there may be selected as a single magnetic substance from Co-based full Heusler alloy $Co_2MnSi$, oxide perovskite $LaSrMnO_3$, etc. exhibiting half-metallic properties (full spin polarization rate 100%) confirmed by first-principles calculation and experiments and which is excellent in combination with a semiconductor material in terms of lattice matching, etc. Or, a general magnetic material such as Fe, Co, CoFe, CoFeB, etc. may be combined with an MgO tunneling barrier to obtain an effectively high spin polarization.

Accordingly, a relatively large signal can be obtained even in multi-bits. That is, performance of a CAM using spin MOSFETs may be improved by increasing the MC ratio. When each spin MOSFET having such a high MC ratio is used, a CAM can be formed in the same manner as the CAM according to the first or second embodiment, and a method of reading data from the CAM and a method of writing data into the CAM can be achieved in the same manner.

As another method, multi stages of sense amplifiers may be provided for amplifying voltages of signals outputted from pairs of spin MOSFETs. To convert an output current of each pair of spin MOSFETs into a voltage and make comparison with the reference cell, the multi stages of sense amplifiers are provided to thereby amplify a small signal voltage outputted from the pair of spin MOSFETs and input the amplified signal voltage to the comparator. Thus, even when the signal outputted from the pair of spin MOSFETs is small, the case where search data and stored data match with each other and the case where search data and stored data mismatch with each other may be discriminated. Even when multi stages of sense amplifiers are provided, the method of reading data from the CAM and the method of writing data into the CAM can be performed in the same manner as in the first or second embodiment.

As a further method, search data of one word may be divided into multi stages. For example, when one word is composed of 8 bits, searching may be performed by two CAM blocks separated by 4 bits. When search data and stored data match with each other in the two blocks, determination can be made that search data of one word matches with stored data. When searching is performed in mulch stages, the speed for searching is not reduced because searching is performed concurrently compared with the case where all bits are searched by CAM cells connected in series. Because searching is performed by separated blocks, the power supply to an unnecessary block can be turned OFF, and power consumption can be decreased. Even when searching is performed in multi stages, the method of reading data from the CAM and the method of writing data into the CAM can be performed as in the first or second embodiment.

Fourth Embodiment

Figure 32:
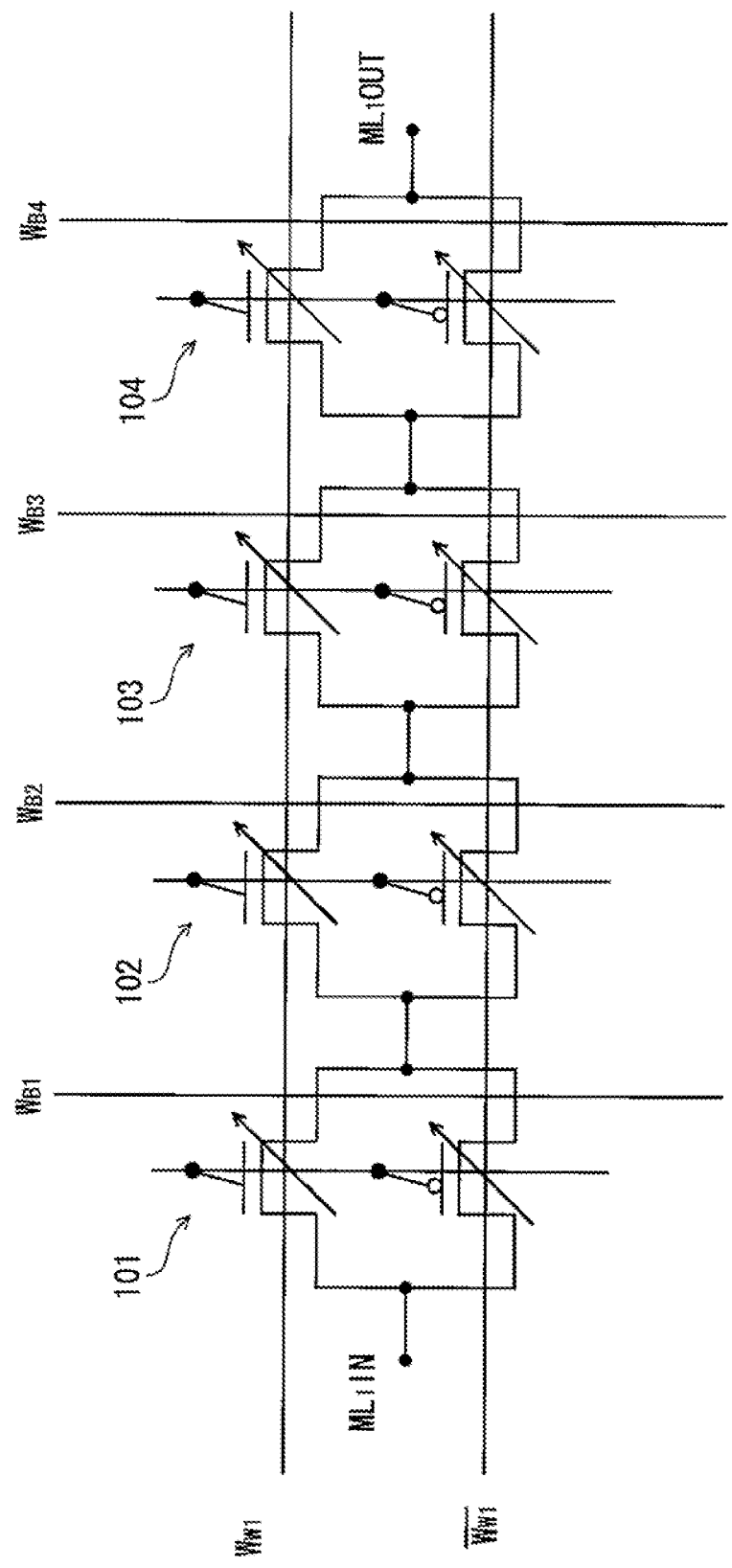
FIG. 32 illustrates a part of a CAM array according to a fourth embodiment.

A fourth embodiment will be described below. In this embodiment, magnetization information is written by current-induced magnetic field. To write magnetization information by current-induced magnetic field, magnetic field write lines are provided so as to be perpendicular to either sources or drains of spin MOSFETs. FIG. 32 illustrates an example of a CAM array in the case where magnetic field write lines are provided so as to be perpendicular to drains so that magnetization information is written in the drains. A part of the CAM array according to this embodiment is illustrated in FIG. 32. Writing magnetization information by current-induced magnetic field uses synthetic magnetic field induced by simultaneously applying a current to magnetic field write lines disposed so as to intersect one another. In a spin MOSFET disposed near an intersection point of magnetic field write lines in which a current flows simultaneously, reversal of magnetization is caused by the synthetic magnetic field.

For example, the case where magnetization information of the first-bit CAM cell 101 in FIG. 32 is written is exemplified. By applying a current to the magnetic field write line $W_{W1}$ rightward in FIG. 32, an upward magnetic field is generated in each spin MOSFET which the magnetic field write line $W_{W1}$ crosses. By applying a current to the magnetic field write line $W_{B1}$ upward in FIG. 32, a leftward magnetic field is generated in each spin MOSFET which the magnetic field write line $W_{B1}$ crosses. As a result, a left upward magnetic field is generated in the n-type spin MOSFET of the CAM cell 101 when a current is applied to the magnetic field write lines $W_{W1}$ and $W_{B1}$ simultaneously. An electrode structure of the spin MOSFET is formed so that the direction of the magnetic field serves as an axis of easy magnetization. Accordingly, it is possible to write magnetization information which differs from the case where a current is applied to the magnetic field write line $W_{B1}$ upward in FIG. 32 while a current is applied to the magnetic field write line $W_{W1}$ rightward in FIG. 32 to the case where a current is applied to the magnetic field write line $W_{B1}$ downward in FIG. 32 while a current is applied to the magnetic field write line $W_{W1}$ leftward in FIG. 32. When writing magnetization information in the n-type spin MOSFET of the CAM cell 101 is completed, magnetization information is written in the p-type spin MOSFET of the CAM cell 101 by use of the magnetic field write lines $W_{W1}$ and $W_{B1}$. Since the method of writing magnetization information in the p-type spin MOSFET is the same as the method of writing magnetization information in the n-type spin MOSFET, description thereof will be omitted.

For reading data from the CAM according to this embodiment, the same method as the reading method according to the first embodiment can be used. Although FIG. 32 illustrates the case where a pair of n-type and p-type spin MOSFETs are used by way of example, either pair of n-type spin MOSFETs or pair of p-type spin MOSFETs may be used as in the second embodiment.

As described above, because the CAM in which magnetization information is written by current-induced magnetic field is larger in energy required for writing when element size is reduced, compared with the CAM in which magnetization information is written by the above-described spin injection magnetization reversal, a design for avoiding the gate input wiring may be required. For example, the influence of leakage magnetic field or the like may be avoided to suppress capacitive coupling. On the other hand, for example, when the size of the spin MOSFET electrode is not smaller than 100 nm, the magnetic field write lines may be provided as in the CAM according to this embodiment to control writing. In this case, because an element read wiring and an element write wiring are provided independently, these wirings may be optimized separately.

The CAM according to the embodiments can operate speedily in a small circuit area with low power consumption. The invention is not limited to the aforementioned embodiments but may be changed suitably without departing from the scope of the invention.

While certain embodiments have been described, these embodiments have been presented by way of example only, and are not intended to limit the scope of the invention. The above-described embodiments may be variously changed; for example, various omissions, substitutions and changes may be applied to the above-described embodiments without departing from the spirit of the inventions. Not only the above-mentioned embodiments but also their modified forms which fall within the scope and spirit of the invention will be covered by Claims and their equivalents.

The invention claimed is:

1. A content addressable memory, comprising:
a pair of spin MOSFETs including:
   a first spin MOSFET whose magnetization state is set in accordance with stored data; and
   a second spin MOSFET whose magnetization state is set in accordance with the stored data, the second spin MOSFET being connected in parallel with the first spin MOSFET;
a first wiring configured to apply a gate voltage so that any one of the first spin MOSFET and the second spin MOSFET becomes electrically conductive in accordance with search data; and
a second wiring configured to apply a current to both of the first spin MOSFET and the second spin MOSFET, wherein the stored data includes three values of "1", "0" and "Don't care", wherein, when the stored data is "1" or "0", the first spin MOSFET is set in a first magnetization state while the second spin MOSFET is set in a second magnetization state, so that resistances thereof are differentiated from each other, and wherein, when the stored data is "Don't care", both of the first spin MOSFET and the second spin MOSFET are set collectively in the first magnetization state.

2. The content addressable memory of claim 1,
wherein a plurality of pairs of spin MOSFETs are connected in series, and
wherein the second wiring applies the current to the pairs of spin MOSFETs.

3. The content addressable memory of claim 1, further comprising:
a comparator configured to compare an output signal of the pair of spin MOSFETs with a reference value to thereby determine whether the stored data and the search data match with each other or not.

4. The content addressable memory of claim 1,
wherein the stored data includes two values, and
wherein, in the pair of spin MOSFETs, one of the first spin MOSFET and the second spin MOSFET is magnetized to have a higher resistance as compared with the other.

5. The content addressable memory of claim 1,
wherein both of the first spin MOSFET and the second spin MOSFET are of an n-type or p-type, and
wherein the first wiring includes a first sub-wiring configured to apply a first voltage to the first spin MOSFET, and a second sub-wiring configured to apply a second voltage different from the first voltage to the second spin MOSFET.

6. The content addressable memory of claim 1, further comprising:
current lines disposed so as to cross either sources or drains of the pair of spin MOSFET.

7. The content addressable memory of claim 1,
wherein one of the first spin MOSFET and the second spin MOSFET is an n-type spin MOSFET whereas the other is a p-type spin MOSFET.

8. A content addressable memory, comprising:
a pair of spin MOSFETs including:
a first spin MOSFET whose magnetization state is set in a first state when stored data is a first value and the magnetization state is set in a second state when the stored data is a second value; and
a second spin MOSFET whose magnetization state is set in the second state when the stored data is the first value and the magnetization state is set in the first state when the stored data is the second value, the second spin MOSFET being connected in parallel with the first spin MOSFET;
a first wiring configured to apply a gate voltage so that any one of the first spin MOSFET and the second spin MOSFET becomes electrically conductive in accordance with search data; and
a second wiring configured to apply a current to both of the first spin MOSFET and the second spin MOSFET,
wherein the stored data includes three values of "1", "0" and "Don't care", wherein, when the stored data is "1" or "0", the first spin MOSFET is set in a first magnetization state while the second spin MOSFET is set in a second magnetization state, so that resistances thereof are differentiated from each other, and wherein, when the stored data is "Don't care", both of the first spin MOSFET and the second spin MOSFET are set collectively in the first magnetization state.

9. The content addressable memory of claim 8,
wherein a plurality of pairs of spin MOSFETs are connected in series, and
wherein the second wiring applies the current to the pairs of spin MOSFETs.

10. The content addressable memory of claim 8, further comprising:
a comparator configured to compare an output signal of the pair of spin MOSFETs with a reference value to thereby determine whether the stored data and the search data match with each other or not.

11. The content addressable memory of claim 8,
wherein the stored data includes two values, and
wherein, in the pair of spin MOSFETs, one of the first spin MOSFET and the second spin MOSFET is magnetized to have a higher resistance as compared with the other.

12. The content addressable memory of claim 8,
wherein both of the first spin MOSFET and the second spin MOSFET are of an n-type or p-type, and
wherein the first wiring includes a first sub-wiring configured to apply a first voltage to the first spin MOSFET, and a second sub-wiring configured to apply a second voltage different from the first voltage to the second spin MOSFET.

13. The content addressable memory of claim 8, further comprising:
current lines disposed so as to cross either sources or drains of the pair of spin MOSFET.

14. The content addressable memory of claim 8,
wherein one of the first spin MOSFET and the second spin MOSFET is an n-type spin MOSFET whereas the other is a p-type spin MOSFET.

15. A content addressable memory, comprising:
a pair of spin MOSFETs including:
a first spin MOSFET whose magnetization state is set in accordance with stored data; and
a second spin MOSFET whose magnetization state is set in accordance with the stored data, the second spin MOSFET being connected in parallel with the first spin MOSFET;
a first wiring configured to:
apply a gate voltage so that any one of the first spin MOSFET and the second spin MOSFET becomes electrically conductive in accordance with search data, and
apply a writing voltage for writing the stored data, which is larger than the gate voltage for searching the search data; and
a second wiring configured to apply a current to both of the first spin MOSFET and the second spin MOSFET.

16. A content addressable memory, comprising:
a plurality of pairs of spin MOSFETs connected in series, each pair of spin MOSFETs including:
a first spin MOSFET whose magnetization state is set in accordance with stored data; and
a second spin MOSFET whose magnetization state is set in accordance with the stored data, the second spin MOSFET being connected in parallel with the first spin MOSFET;
a first wiring configured to apply a gate voltage so that any one of the first spin MOSFET and the second spin MOSFET becomes electrically conductive in accordance with search data; and a second wiring configured to apply a current to the pairs of spin MOSFETs; and a control circuit configured to set magnetization states of the series-connected pairs of spin MOSFETs, by, while applying the gate voltage such that spin MOSFETs to be set into a first magnetization state among the series-connected pairs of spin MOSFETs are made electrically conductive, applying a current not smaller than a predetermined threshold to the series-connected pairs of spin MOSFETs in a first direction, and, while applying the gate voltage such that spin MOSFETs to be set into a second magnetization state different from the first magnetization state are made electrically conductive, applying the current not smaller than the predetermined threshold to the series-connected pairs of spin MOSFETs in a second direction reverse to the first direction.

17. A content addressable memory, comprising:

a pair of spin MOSFETs including:
 a first spin MOSFET whose magnetization state is set in a first state when stored data is a first value and the magnetization state is set in a second state when the stored data is a second value; and
 a second spin MOSFET whose magnetization state is set in the second state when the stored data is the first value and the magnetization state is set in the first state when the stored data is the second value, the second spin MOSFET being connected in parallel with the first spin MOSFET;

a first wiring configured to:
 apply a gate voltage so that any one of the first spin MOSFET and the second spin MOSFET becomes electrically conductive in accordance with search data, and
 apply a writing voltage for writing the stored data, which is larger than the gate voltage for searching the search data; and a second wiring configured to apply a current to both of the first spin MOSFET and the second spin MOSFET.

18. A content addressable memory, comprising:

a plurality of pairs of spin MOSFETs connected in series, each pair of spin MOSFETs including:
 a first spin MOSFET whose magnetization state is set in a first state when stored data is a first value and the magnetization state is set in a second state when the stored data is a second value; and
 a second spin MOSFET whose magnetization state is set in the second state when the stored data is the first value and the magnetization state is set in the first state when the stored data is the second value, the second spin MOSFET being connected in parallel with the first spin MOSFET;

a first wiring configured to apply a gate voltage so that any one of the first spin MOSFET and the second spin MOSFET becomes electrically conductive in accordance with search data; and a second wiring configured to apply a current to the pairs of spin MOSFETs; and a control circuit configured to set magnetization states of the series-connected pairs of spin MOSFETs, by, while applying the gate voltage such that spin MOSFETs to be set into a first magnetization state among the series-connected pairs of spin MOSFETs are made electrically conductive, applying a current not smaller than a predetermined threshold to the series-connected pairs of spin MOSFETs in a first direction, and, while applying the gate voltage such that spin MOSFETs to be set into a second magnetization state different from the first magnetization state are made electrically conductive, applying the current not smaller than the predetermined threshold to the series-connected pairs of spin MOSFETs in a second direction reverse to the first direction.

\* \* \* \* \*